(12) United States Patent
Lee et al.

(10) Patent No.: US 11,202,376 B2
(45) Date of Patent: Dec. 14, 2021

(54) ELECTRONIC DEVICE INCLUDING HOUSING AND METHOD FOR MANUFACTURING HOUSING THEREOF

(71) Applicant: Samsung Electronics Co., Ltd., Suwon-si (KR)

(72) Inventors: Dong-Ik Lee, Seoul (KR); Hyeong-Sam Son, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/606,565

(22) PCT Filed: Apr. 6, 2018

(86) PCT No.: PCT/KR2018/004067
§ 371 (c)(1),
(2) Date: Oct. 18, 2019

(87) PCT Pub. No.: WO2018/199499
PCT Pub. Date: Nov. 1, 2018

(65) Prior Publication Data
US 2020/0187368 A1 Jun. 11, 2020

(30) Foreign Application Priority Data

Apr. 28, 2017 (KR) ........................ 10-2017-0055659

(51) Int. Cl.
*H05K 5/00* (2006.01)
*H04M 1/02* (2006.01)
(Continued)

(52) U.S. Cl.
CPC ............ *H05K 5/0017* (2013.01); *H04M 1/02* (2013.01); *H05K 3/325* (2013.01); *H05K 3/36* (2013.01)

(58) Field of Classification Search
CPC ........ H05K 5/0017; H05K 3/325; H05K 3/36; H04M 1/02
See application file for complete search history.

(56) References Cited

U.S. PATENT DOCUMENTS 7,042,156 B2 * 5/2006 Sakamoto ............... H01J 9/261
313/583
9,985,345 B2 * 5/2018 Ferretti ............... H04M 1/0202
(Continued)

FOREIGN PATENT DOCUMENTS

KR 10-2011-0048490 A 5/2011
KR 10-2011-0072241 A 6/2011
(Continued)

OTHER PUBLICATIONS

Korean Office Action with English translation dated Dec. 17, 2020; Korean Appln. No. 10-2017-0055659.

*Primary Examiner* — Rockshana D Chowdhury
*Assistant Examiner* — Douglas R Burtner
(74) *Attorney, Agent, or Firm* — Jefferson IP Law, LLP

(57) ABSTRACT

An electronic device according to various embodiments of the present invention comprises: a housing including a first plate facing in a first direction, a second plate facing in a second direction, and a side part surrounding a space between the first plate and the second plate; a display exposed through the first plate; a wireless communication circuit; and a processor, wherein the second plate includes: a first metal member and a second metal member, wherein the first metal member further includes a first side part facing a portion of the non-metallic extension part, and the second metal member further includes a second side part facing the first side part or another portion of the non-metallic extension part, and wherein the second plate includes an oxidized layer. The electronic device described above and the method (Continued)

for fabricating a housing of the electronic device may be diversified according to embodiments.

2 Claims, 27 Drawing Sheets

(51) Int. Cl.
  *H05K 3/32* (2006.01)
  *H05K 3/36* (2006.01)

(56) References Cited

U.S. PATENT DOCUMENTS

| | | | |
|---|---|---|---|
| 9,988,725 B2* | 6/2018 | Choi | C25D 11/243 |
| 2006/0290875 A1* | 12/2006 | Shives | G02F 1/133308 |
| | | | 349/161 |
| 2011/0123816 A1 | 5/2011 | Husemann et al. | |
| 2013/0318766 A1* | 12/2013 | Kiple | B23P 11/00 |
| | | | 29/428 |
| 2015/0050968 A1* | 2/2015 | Jeon | C25D 11/26 |
| | | | 455/575.1 |
| 2016/0044801 A1* | 2/2016 | Lee | H04M 1/0202 |
| | | | 361/679.55 |
| 2016/0072932 A1* | 3/2016 | Hill | H04M 1/02 |
| | | | 455/575.1 |
| 2016/0234949 A1* | 8/2016 | Seo | H05K 5/03 |
| 2017/0077727 A1 | 3/2017 | Kim et al. | |
| 2017/0094818 A1 | 3/2017 | Kim et al. | |
| 2017/0295654 A1* | 10/2017 | Choi | H05K 5/0017 |
| 2018/0257180 A1* | 9/2018 | Jeon | C22C 21/10 |
| 2018/0299924 A1 | 10/2018 | Seo et al. | |
| 2018/0301792 A1* | 10/2018 | Park | H01Q 7/00 |
| 2019/0159355 A1* | 5/2019 | Baek | G06F 1/1698 |
| 2021/0037126 A1* | 2/2021 | Yoo | H04M 1/0266 |

FOREIGN PATENT DOCUMENTS

| | | |
|---|---|---|
| KR | 10-2012-0099983 A | 9/2012 |
| KR | 10-2014-0135350 A | 11/2014 |
| KR | 10-2015-0012312 A | 2/2015 |
| KR | 10-2015-0115529 A | 10/2015 |
| KR | 10-1571289 B1 | 11/2015 |
| KR | 101571289 B1 * | 11/2015 |
| KR | 10-2016-0057854 A | 5/2016 |
| KR | 10-2017-0031594 A | 3/2017 |
| KR | 10-2017-0036360 A | 4/2017 |
| KR | 10-2017-0070636 A | 6/2017 |

* cited by examiner (a)

(b)

ELECTRONIC DEVICE INCLUDING HOUSING AND METHOD FOR MANUFACTURING HOUSING THEREOF

CROSS-REFERENCE TO RELATED APPLICATION(S)

This application is a National Phase Entry of PCT International Application No. PCT/KR2018/004067, which was filed on Apr. 6, 2018, and claims priority to Korean Provisional Patent Application No. 10-2017-0055659 filed on Apr. 28, 2017 in the Korean Intellectual Property Office, the contents of which are incorporated herein by reference.

BACKGROUND

1. Field

Various embodiments of the present invention relate to electronic devices, e.g., electronic devices including a metal housing and methods of manufacturing housings of the same.

2. Description of the Related Art

Generally, the term "electronic device" may mean a device performing a particular function according to its equipped program, such as a home appliance, an electronic scheduler, a portable multimedia player, a mobile communication terminal, a tablet PC, a video/sound device, a desktop PC or laptop computer, a navigation device for an automobile, etc.

A metal housing of an electronic device, which forms the outer appearance of the electronic device may protect its circuitry from the external environment and give a better aesthetic look to the electronic device.

SUMMARY

The housing of an electronic device which forms the outer appearance of the electronic device may be formed using metal sheets or metal plates. A housing for an electronic device may be prepared by forming a casing for the electronic device using forging or pressing and then performing a cutting process, e.g., computer numerical control (CNC), thereon. In an electronic device, e.g., a portable terminal, a metal part of the housing may be segmented into several pieces, one of which may be insulated from the rest and be used as an antenna. As insert molding is performed with the segments of the metal part placed in a single mold, the segments of the metal part may be connected together via a non-metallic material, thereby forming a housing of the final shape. By performing surface treatment on the metal part of the housing of the final shape, the housing may remain more rigidly in its unique metallic color or sheen and be decorated in various colors or patterns.

CNC processing may be used in cutting a metal sheet or metal plate. For example, a metal sheet or plate may be cut or processed into a desired shape by pressing and CNC processing. However, the manufacture of a housing of an electronic device using pressing, insert-molding, or CNC processing is time consuming due to CNC processing and suffers from increased costs and materials. If performed after the final appearance has been formed for the electronic device (e.g., the metal part of the housing), insert-molding may leave a dent in the outer surface of the metal part and additional processes, such as cutting (e.g., CNC cutting) or polishing, may thus be required.

According to various embodiments of the present invention, there may be provided an electronic device and method of manufacturing a housing of an electronic device, which may save time, costs, and materials.

According to various embodiments of the present invention, there may be provided an electronic device and method of manufacturing a housing of an electronic device which enable to secure dimensional stability for the metal part and insulating part while forming the housing by attaching the metal part and the insulating part.

According to an embodiment of the present invention, a housing including a first plate facing in a first direction, a second plate facing in a second direction which is opposite to the first direction and spaced apart and facing away from the first plate, and a side part surrounding a space between the first plate and the second plate and integrally formed or coupled with the second plate; a display exposed through a portion of the first plate, a wireless communication circuit provided inside the housing; and a processor provided inside the housing and electrically connected with the display and the wireless communication circuit, wherein the second plate includes a first metal member including a first outer surface facing in the second direction and a second metal member including a second outer surface facing in the second direction and separated from the first metal member by a non-metallic extension part, wherein the first metal member further includes a first side part facing a portion of the non-metallic extension part in a third direction perpendicular to the first direction, and the second metal member further includes a second side part facing the first side part or another portion of the non-metallic extension part in a fourth direction opposite to the third direction, and wherein the second plate may include an oxidized layer in at least a portion of the first side part and the second side part, the second outer surface, and the first outer surface.

According to an embodiment of the present invention, a first metal member including a first outer surface, a second metal member including a second outer surface facing in the same direction as the first outer surface and spaced apart from the first metal member, and an insulating part attached and coupled to inner surfaces of the first metal member and the second metal member and disposed in a space between the first metal member and the second metal member and inside the first metal member and the second metal member.

The insulating part may be segmented into two non-metallic members. At least one of the non-metallic members may include the non-metallic extension part seated in the space between the first metal member and the second metal member to separate the first metal member from the second metal member.

According to various embodiments of the present invention, there is provided a method of manufacturing a housing of an electronic device, the housing including a first plate facing in a first direction, a second plate facing in a second direction which is opposite to the first direction and spaced apart and facing away from the first plate, and a side part surrounding a space between the first plate and the second plate and integrally formed or coupled with the second plate, the method comprising: forming a metal part of the second plate; and attaching an insulating part to the formed metal part, wherein the metal part includes a first metal member including a first outer surface facing in the second direction and a second metal member including a second outer surface facing in the second direction and separated from the first metal member by a non-metallic extension part of the insulating part, wherein the first metal member includes a first side part facing the non-metallic extension part in a third direction perpendicular to the first direction, and the second metal member includes a second side part facing the first side part and the insulating part in a fourth direction opposite to the third direction, and wherein forming the metal part includes a surface treatment operation to form an oxidized layer on the first outer surface of the second plate, the second outer surface, and at least a portion of the first side part and at least a portion of the second side part.

According to various embodiments of the present invention, an electronic device and method of manufacturing a housing of the electronic device may form a segmented and processed metal part by press-processing a metal sheet or plate and cutting the same by CNC processing and form a non-metallic insulating part to the segmented and processed metal part, thereby saving time and materials.

According to various embodiments of the present invention, an electronic device and method of manufacturing a housing of the electronic device may attach a segmented insulating part to a segmented and processed metal part, thereby minimizing the occurrence of gaps due to the manufacturing tolerances of the metal part and insulating part.

According to various embodiments of the present invention, an electronic device and method of manufacturing a housing of the electronic device may perform surface treatment (e.g., anodizing) while the metal members into which a metal part is segmented by a bridge member are connected to the segments of the metal part, thereby reducing the steps of process.

DETAILED DESCRIPTION

Figure 1:
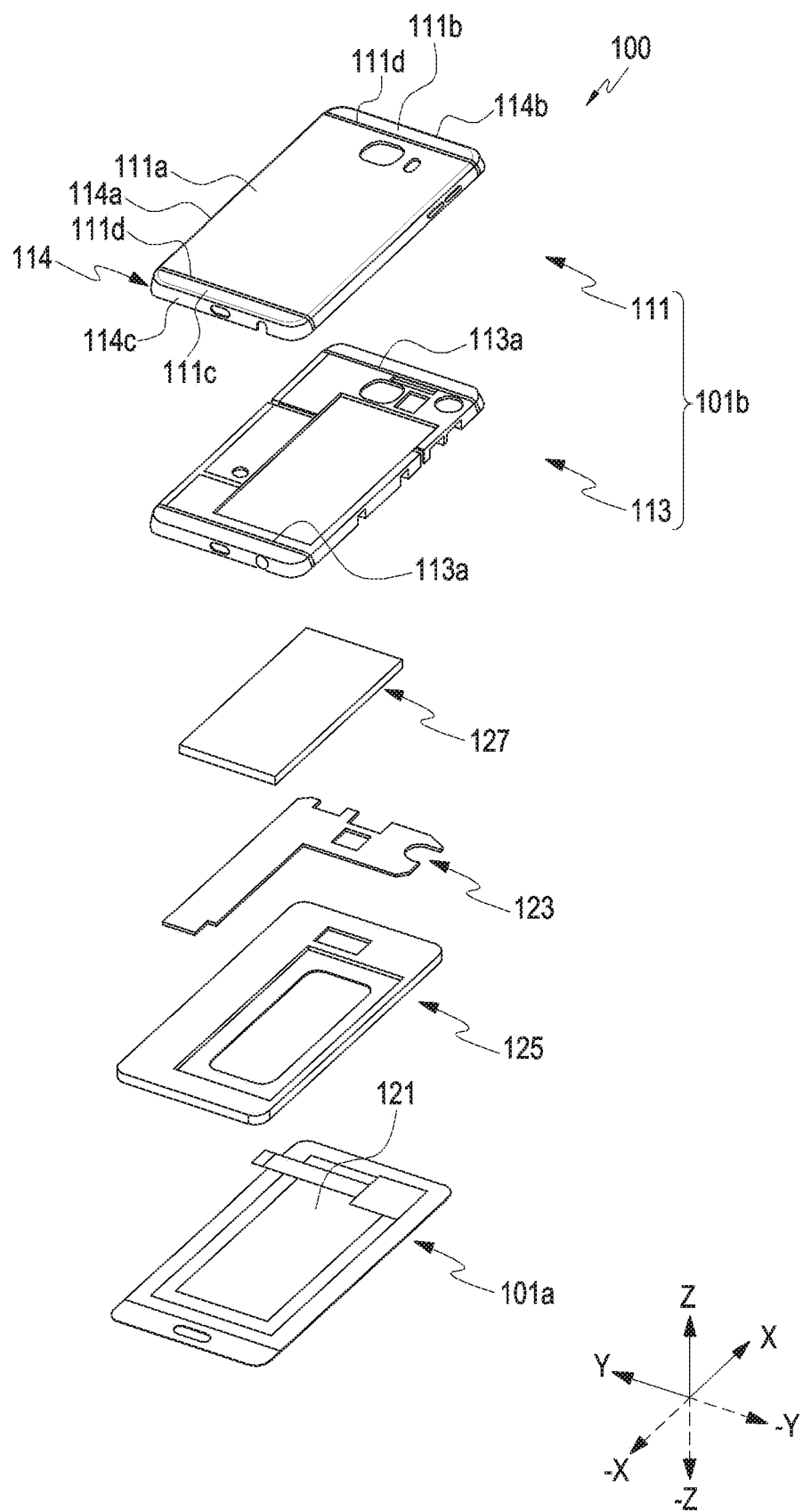
FIG. 1 is an exploded perspective view illustrating an electronic device according to various embodiments of the present invention.

Hereinafter, embodiments of the present disclosure are described with reference to the accompanying drawings. However, it should be appreciated that the present disclosure is not limited to the embodiments, and all changes and/or equivalents or replacements thereto also belong to the scope of the present disclosure. The same or similar reference denotations may be used to refer to the same or similar elements throughout the specification and the drawings.

As used herein, the terms "have," "may have," "include," or "may include" a feature (e.g., a number, function, operation, or a component such as a part) indicate the existence of the feature and do not exclude the existence of other features.

As used herein, the terms "A or B," "at least one of A and/or B," or "one or more of A and/or B" may include all possible combinations of A and B. For example, "A or B," "at least one of A and B," "at least one of A or B" may indicate all of (1) including at least one A, (2) including at least one B, or (3) including at least one A and at least one B.

As used herein, the terms "first" and "second" may modify various components regardless of importance and do not limit the components. These terms are only used to distinguish one component from another. For example, a first user device and a second user device may indicate different user devices from each other regardless of the order or importance of the devices. For example, a first component may be denoted a second component, and vice versa without departing from the scope of the present disclosure.

It will be understood that when an element (e.g., a first element) is referred to as being (operatively or communicatively) "coupled with/to," or "connected with/to" another element (e.g., a second element), it can be coupled or connected with/to the other element directly or via a third element. In contrast, it will be understood that when an element (e.g., a first element) is referred to as being "directly coupled with/to" or "directly connected with/to" another element (e.g., a second element), no other element (e.g., a third element) intervenes between the element and the other element.

As used herein, the terms "configured (or set) to" may be interchangeably used with the terms "suitable for," "having the capacity to," "designed to," "adapted to," "made to," or "capable of" depending on circumstances. The term "configured (or set) to" does not essentially mean "specifically designed in hardware to." Rather, the term "configured to" may mean that a device can perform an operation together with another device or parts. For example, the term "processor configured (or set) to perform A, B, and C" may mean a generic-purpose processor (e.g., a CPU or application processor) that may perform the operations by executing one or more software programs stored in a memory device or a dedicated processor (e.g., an embedded processor) for performing the operations.

The terms as used herein are provided merely to describe some embodiments thereof, but not to limit the scope of other embodiments of the present disclosure. It is to be understood that the singular forms "a," "an," and "the" include plural references unless the context clearly dictates otherwise. All terms including technical and scientific terms used herein have the same meaning as commonly understood by one of ordinary skill in the art to which the embodiments of the present disclosure belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some cases, the terms defined herein may be interpreted to exclude embodiments of the present disclosure.

Examples of the electronic device may include at least one of a smartphone, a tablet personal computer (PC), a mobile phone, a video phone, an e-book reader, a desktop PC, a laptop computer, a netbook computer, a workstation, a PDA (personal digital assistant), a portable multimedia player (PMP), an MP3 player, a mobile medical device, a camera, or a wearable device (e.g., smart glasses, a head-mounted device (HMD), electronic clothes, an electronic bracelet, an electronic necklace, an electronic appcessory, an electronic tattoo, a smart mirror, or a smart watch).

According to an embodiment of the present invention, the electronic device may be a smart home appliance. Examples of the smart home appliance may include at least one of a television, a digital video disk (DVD) player, an audio player, a refrigerator, an air conditioner, a cleaner, an oven, a microwave oven, a washer, a dryer, an air cleaner, a set-top box, a home automation control panel, a security control panel, a TV box (e.g., Samsung HomeSync™, Apple TV™, or Google TV™), a gaming console (Xbox™, PlayStation™), an electronic dictionary, an electronic key, a camcorder, or an electronic picture frame.

According to other embodiments, examples of the electronic device may include at least one of various medical devices (e.g., diverse portable medical measuring devices (a blood sugar measuring device, a heartbeat measuring device, or a body temperature measuring device), a magnetic resource angiography (MRA) device, a magnetic resource imaging (MRI) device, a computed tomography (CT) device, an imaging device, or an ultrasonic device), a navigation device, a global positioning satellite (GPS) receiver, an event data recorder (EDR), a flight data recorder (FDR), an automotive infotainment device, a sailing electronic device (e.g., a sailing navigation device or a gyro compass), avionics, security devices, vehicular head units, industrial or home robots, automatic teller's machines (ATMs), point of sales (POS) devices, or internet of things (IoT) devices (e.g., a bulb, various sensors, an electric or gas meter, a sprinkler, a fire alarm, a thermostat, a street light, a toaster, fitness equipment, a hot water tank, a heater, or a boiler).

According to some embodiments, examples of the electronic device may at least one of part of a piece of furniture or building/structure, an electronic board, an electronic signature receiving device, a projector, or various measurement devices (e.g., devices for measuring water, electricity, gas, or electromagnetic waves). According to an embodiment, the electronic device may be one or a combination of the above-listed devices. According to some embodiments, the electronic device may be a flexible electronic device. The electronic device disclosed herein is not limited to the above-listed devices and may include new electronic devices depending on the development of technology.

Figure 2:
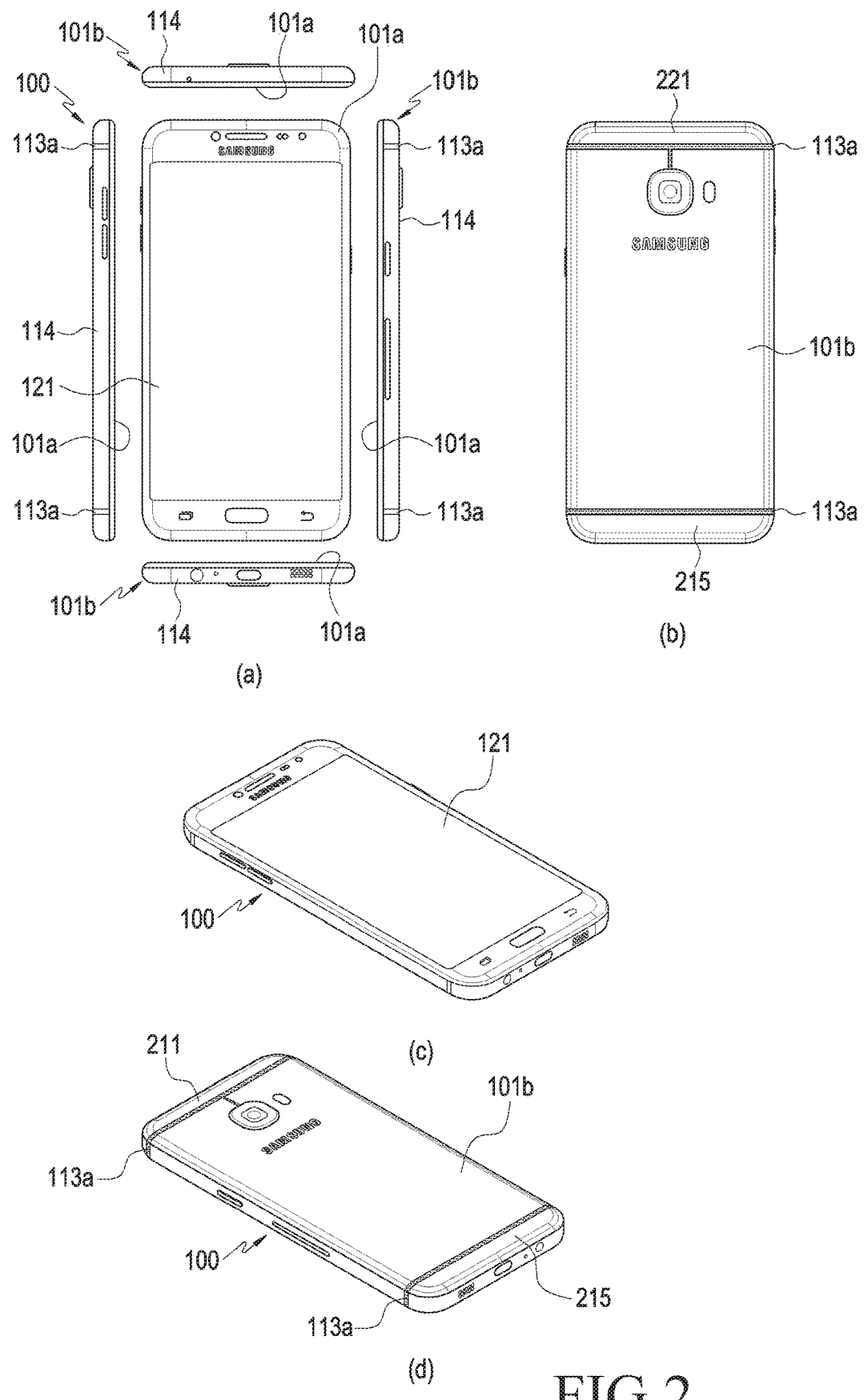
FIG. 2 illustrates six side views, a front perspective view, and a rear perspective view illustrating an electronic device according to various embodiments of the present invention.

FIG. 1 is an exploded perspective view illustrating an electronic device according to various embodiments of the present invention. FIG. 2 illustrates six side views, a front perspective view, and a rear perspective view illustrating an electronic device according to various embodiments of the present invention.

Referring to FIGS. 1 and 2, according to various embodiments of the present invention, an electronic device 100 may include a housing including a first plate 101a, a second plate 101b, and a side part 114. An antenna member, a display 121, a wireless communication circuit, a processor, a printed circuit board 123, a battery 127, and a support plate 125 may be disposed in the housing.

According to an embodiment, the antenna member may include a radiation conductor in which conducting wires may be coiled or looped, and the electronic device 100 may perform wireless power transmission/reception and near-field wireless communication (NFC) via the antenna member. For example, the antenna member may be disposed between the first plate 101a and the second plate 101b, e.g., on an inner surface of the second plate 101b. According to another embodiment, portions 211 and 215 of the housing may be formed as antenna members of the electronic device 100. For example, the portions 211 and 215 of the housing may be electrically connected with other antenna members or the ground pad or wireless communication module provided on the printed circuit board 123 via electrical connecting means, e.g., conducting tapes, pogo pins, or soldering. The antenna member which is formed as a portion of the housing may receive electric current from the printed circuit board 123, and the portion of the housing, itself or in combination of other antenna member, may transmit or receive wireless electromagnetic waves. Configurations to form portions of the housing as antenna members are disclosed in Korean Patent Application Publication No. 10-2015-0051588 (published on May 13, 2015) and U.S. Patent Application Publication No. 2015/0123857 (published on May 7, 2015) and no detailed description thereof is given.

According to various embodiments, the display 121 may be provided in the housing to be exposed through the front surface of the housing. A touch panel may be integrated with the display 121, and a combination of the display 121 and the touch panel may form an input device.

The printed circuit board 123 may be disposed between the display 121 and the second plate 101b inside the housing. According to an embodiment, a processor, a wireless communication module, a sound module, a power management module, and various sensors may be mounted on the printed circuit board 123. In some embodiments, the processor, communication module, sound module, power management module, and various sensors each may be formed in an independent integrated circuit chip or at least two thereof may be integrated into a single integrated circuit chip. The display 121 or the wireless communication module may be electrically connected with the processor.

According to an embodiment, the support plate 125 may be disposed between the first plate 101a and the second plate 101b, e.g., between the display 121 and the printed circuit board 123. The support plate 125 may maintain or enhance the stiffness of the housing and, if formed of a conducting material, it may be utilized as a shielding member to shield off electromagnetic interference.

According to an embodiment, as viewed from FIG. 1, the direction from the second plate 101b to the first plate 101a may be referred to as a first direction of the electronic device 100, and the direction opposite to the first direction may be referred to as a second direction of the electronic device 100. According to an embodiment, the lengthwise direction perpendicular to the first direction and from the bottom to top of the electronic device 100 may be referred to as a third direction, and the direction opposite to the third direction may be referred to as a fourth direction. According to an embodiment, the width direction perpendicular to the first direction and the third direction and from the left to right of one surface where the display 121 of the electronic device 100 is mounted may be referred to as a fifth direction, and the direction opposite to the fifth direction may be referred to as a sixth direction.

According to various embodiments, the first plate 101a may form the front surface of the housing, and the second plate 101b may form the back surface of the housing, and the side part 114 may form the side circumference of the housing.

According to various embodiments, the first plate 101a may be disposed to face in the first direction. The second plate 101b may be disposed to face in the second direction. According to an embodiment, the first plate 101a may be disposed to substantially face the second plate 101b while spaced apart from the second plate 101b at a predetermined interval in the first direction. The first plate 101a may include, e.g., a window. For example, the first plate 101a may be coupled with the second plate 101b to thereby form the front surface of the housing, and the display 121 may be exposed through a portion of the first plate 101a.

According to an embodiment, the second plate 101b may include a metal part 111 and an insulating part 113. The second plate 101b may be provided by attaching the metal part 111 and the insulating part 113.

According to various embodiments, the metal part 111 may include at least two metal members 111a, 111b, and 111c into which the metal part 111 is separated from each other by segmenters 111d. According to an embodiment, at least one side wall(s) 114a, 114b, and 114c may be formed in the metal members 111a, 111b, and 111c. If the metal members 111a, 111b, and 111c are combined with the insulating part 113, the side walls 114a, 114b, and 114c formed in the metal members 111a, 111b, and 111c may be engaged with each other, thereby forming the side part 114 of the second plate 101b. According to an embodiment, the side part 114 may be integrated or coupled with the metal members 111a, 111b, and 111c.

According to various embodiments, at least one of the metal members 111a, 111b, and 111c separated by the segmenters 111d may be utilized as an antenna member.

According to various embodiments, the insulating part 113 may be attached onto an inner surface of the metal part 111, and portions of the insulating part 113 may be disposed in the segmenters 111d to be partially exposed. The insulating part 113 may connect the metal members 111a, 111b, and 111c which are separated by the segmenters 111d.

The configuration of the metal part and the insulating part is described below in detail with reference to FIGS. 3, 4, 5, 6, 7, 8, 9, 10, 11, 12, 13, 14, 15, 16, 17, 18, and 19.

Figure 3:
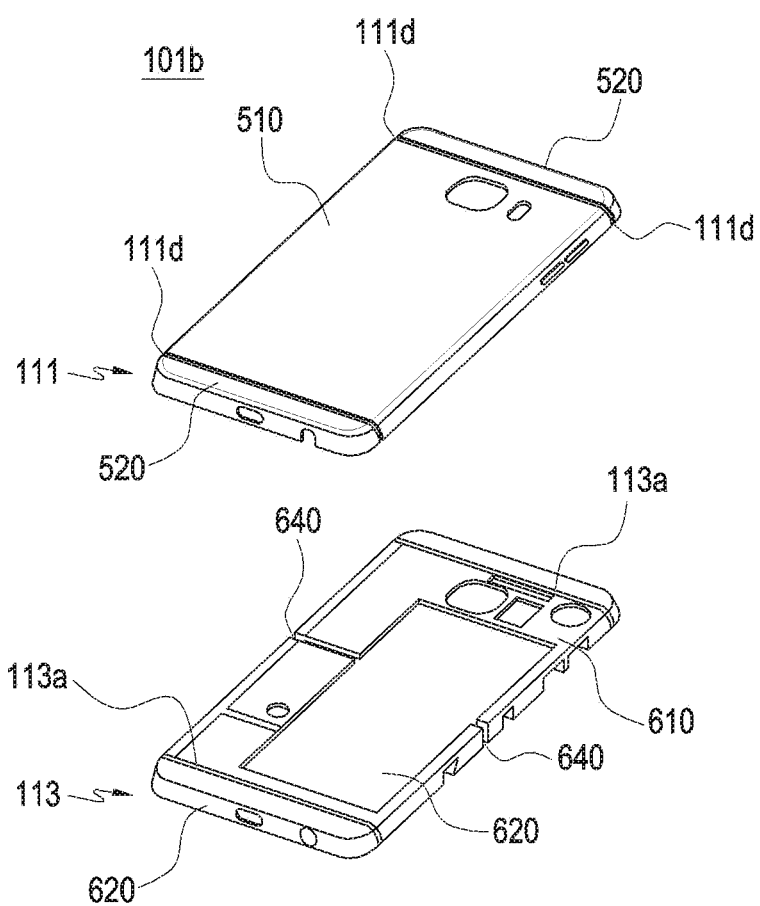
FIG. 3 is an exploded perspective view illustrating parts (a metal part and an insulating part) of a housing according to various embodiments of the present invention.
Figure 4:
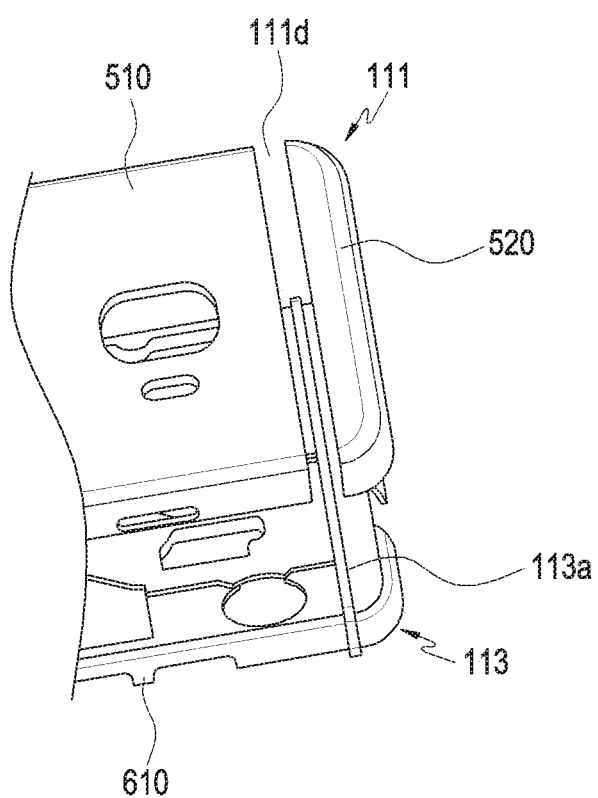
FIG. 4 is a partially exploded perspective view illustrating parts (a metal part and an insulating part) of a housing of an electronic device according to various embodiments of the present invention.

FIG. 3 is an exploded perspective view illustrating parts (a metal part 111 and an insulating part 113) of a housing according to various embodiments of the present invention. FIG. 4 is a partially exploded perspective view illustrating parts (a metal part and an insulating part) of a housing of an electronic device according to various embodiments of the present invention.

According to various embodiments, the housing of an electronic device (e.g., the electronic device 100 of FIGS. 1 and 2), e.g., the second plate (also refer to 101*b* of FIG. 1) may be formed by attaching the insulating part (e.g., 113 of FIG. 1) of a non-metallic material, which has been processed (e.g., insert-molded) to have the inner shape of the second plate 101*b* to the metal part 111 processed to have the outer shape of the second plate 101*b* by processing a metal sheet or metal plate.

According to various embodiments, the metal part 111 may include a first metal member 510 and a second metal member 520 which are separated from each other by the segmenter 111*d*.

According to various embodiments, the insulating part 113 may be attached onto the inner surface of the metal part 111 and a portion (hereinafter, a 'non-metallic extension part 113*a*') of the insulating part 113 may be provided between the first metal member 510 and the second metal member 520, e.g., in the segmenter 111*d*. According to various embodiments, the insulating part 113 may be divided into two non-metallic members 610 and 620 at a segmenting portion 640 along the width direction of the electronic device.

The non-metallic extension part 113*a* may be disposed in the segmenter 111*d* to electrically insulate the first metal member 510 and the second metal member 520.

According to an embodiment, the insulating part 113 may be attached to the first metal member 510 and the second metal member 520 by a separate coupling member.

The detailed configuration of the metal part 111 is described in greater detail with reference to FIGS. 5, 6, and 7. The detailed configuration of the insulating part 113 is described in greater detail with reference to FIGS. 8 and 9. The configuration of the coupling member is described in greater detail with reference to FIGS. 10 and 11.

Figure 5:
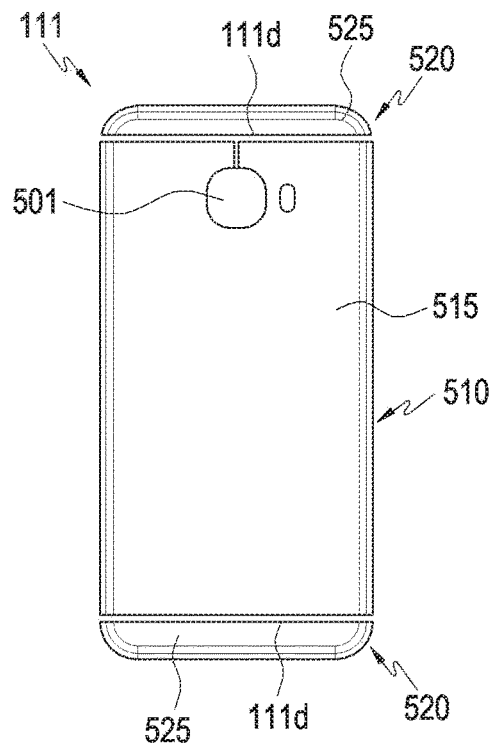
FIG. 5 is an external plan view illustrating a part (a metal part) of a housing of an electronic device according to various embodiments of the present invention.

FIG. 5 is an external plan view illustrating a part (a metal part) of a housing of an electronic device according to various embodiments of the present invention. FIG. 6 is an internal plan view illustrating a part (a metal part) of a housing of an electronic device according to various embodiments of the present invention. FIG. 7 is a view illustrating one surface (a surface contacting an insulating part) of a part (a metal part) of a housing of an electronic device according to various embodiments of the present invention.

Figure 6:
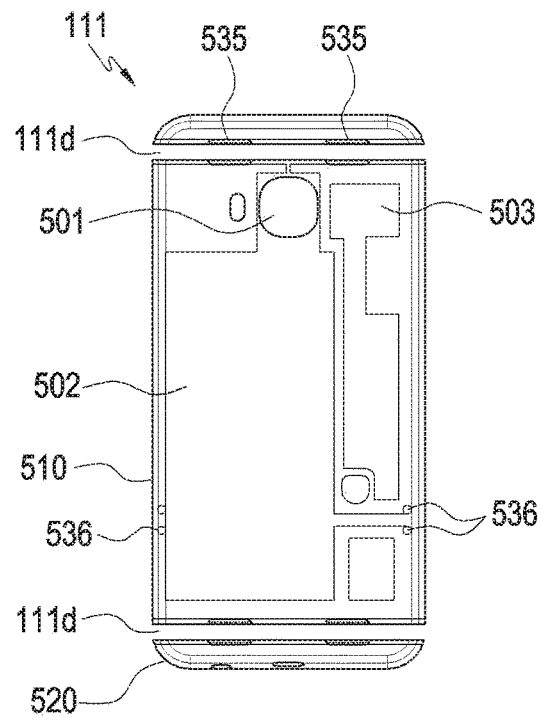
FIG. 6 is an internal plan view illustrating a part (a metal part) of a housing of an electronic device according to various embodiments of the present invention.
Figure 7:
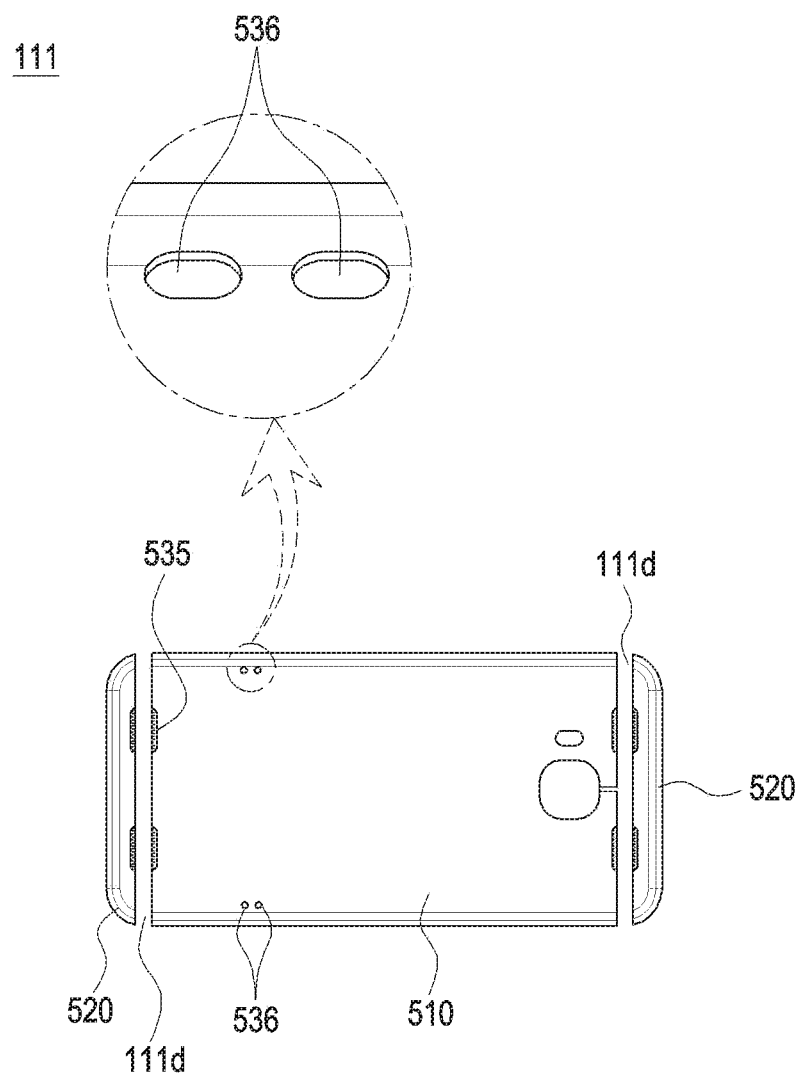
FIG. 7 is a view illustrating one surface (a surface contacting an insulating part) of a part (a metal part) of a housing of an electronic device according to various embodiments of the present invention.

It is noted that the structures shown in FIGS. 5, 6, and 7 only regard the shape of the metal part 111 where the insulating part 113 is not attached.

Referring to FIGS. 5, 6, and 7, according to various embodiments of the present invention, the metal part 111 may be split into a plurality of metal members 510 and 520 (also refer to 111*a*, 111*b*, and 111*c* of FIG. 1), e.g., the first metal member 510 and the second metal member 520, by at least one segmenter 111*d*, and at least one of the metal members 510 and 520 may be utilized as an antenna member. According to an embodiment, the metal part 111 may be separated into three metal members 510 and 520 (also refer to 111*a*, 111*b*, and 111*c* of FIG. 1), e.g., the first metal member 510, the second metal member (denoted with '520' and positioned at a relatively upper side of FIG. 5) disposed in the third direction of the first metal member 510, and the second metal member (denoted with '520' and positioned at a relatively lower side of FIG. 5) disposed in the fourth direction of the first metal member 510. According to an embodiment, the second metal members 520 disposed in the third and fourth directions of the first metal member 510 may be segmented to be shorter in length (e.g., as measured along the third direction or fourth direction) than the first metal member 510.

According to another embodiment, the metal part 111 may be separated into two metal members at an upper or lower portion thereof. According to an embodiment, in a case where the metal part 111 is segmented into two metal members at an upper portion thereof, the upper metal member of the segmenter 111*d* may be shorter in length (e.g., as measured along the third or fourth direction) than the lower metal member. According to another embodiment, in a case where the metal part 111 is segmented into two metal members at a lower portion thereof, the lower metal member of the segmenter 111*d* may be shorter in length (e.g., as measured along the third or fourth direction) than the upper metal member.

The first metal member 510 and the second metal members 520 may be aligned along the third direction (or fourth direction) while spaced apart from each other by the segmenters 111*d*.

According to an embodiment, the first metal member 510 may include a first outer surface 515 which faces in the second direction. The second metal members 520 may be spaced apart from the first metal member 510 by the segmenters 111*d* and may include second outer surfaces 525 which face in the second direction. The second metal members 520 may be electrically separated from the first metal member 510 by insulating parts (e.g., 113 of FIG. 3) and may be mechanically connected with the first metal member 510.

According to various embodiments, the metal part 111 may include notches or holes 501, 502, 503, 535, and 536. According to an embodiment, the notches or holes 501, 502, 503, 535, and 536 may be formed to receive (e.g., the hole denoted with reference number '502') at least part of the battery (e.g., the battery 127 of FIG. 1). According to another embodiment, another one or part (e.g., the hole denoted with reference number '501') of the notches or holes 501, 502, 503, 535, and 536 may be formed through the metal members 510 and 520 to provide a capturing path for the camera module (e.g., the camera module 225 of FIG. 2). According to another embodiment, some, e.g., hole(s) denoted with reference number '536' among the notches or holes 501, 502, 503, 535, and 536 may provide a path or means to fasten or set a coupling position upon attaching the insulating part (113 of FIG. 1) and one of the metal members 510 and 520.

For example, for the purpose of the path or means to fasten or set the coupling position when the insulating part (113 of FIG. 1) is attached, position setting parts 536 may be provided on the inner surfaces of the first metal member 510 and the second metal members 520.

The position setting parts 536 may be coupled to guide parts of the insulating part 113 and set a coupling position of the insulating part 113 for the first metal member 510 and the second metal members 520. The first metal member 510 and the second metal members 520 may be produced by processing (e.g., press-processing and CNC processing) a metal plate with a limited thickness, the position setting parts 536 may be formed by engraving, e.g., as incised holes. According to an embodiment, the position setting parts 536 may be formed as long holes in the inner surfaces of the first metal member 510 and the second metal members 520. The long holes may be elongated along the third (or fourth) direction. For example, as the position setting parts 536 are formed as long holes along the third or fourth direction, they may permit linear movement of the non-metallic members 610 and 620 on the first metal member 510 and the second metal members 520.

The number, position, and shape of the notches or holes 501, 502, 503, 535, and 536 may be varied according to embodiments. For example, in a case where the electronic device (e.g., the electronic device 100 of FIG. 2) is a mobile communication terminal, hole(s) corresponding to, e.g., ground pin(s) provided to provide a ground for antennas disposed inside the housing may be further formed in the metal part 111.

According to various embodiments, an oxidized layer may be formed on the surface of the metal part 111 by surface treatment. The oxidized layer is described below in greater detail with reference to FIGS. 17, 18, and 19.

Figure 8:
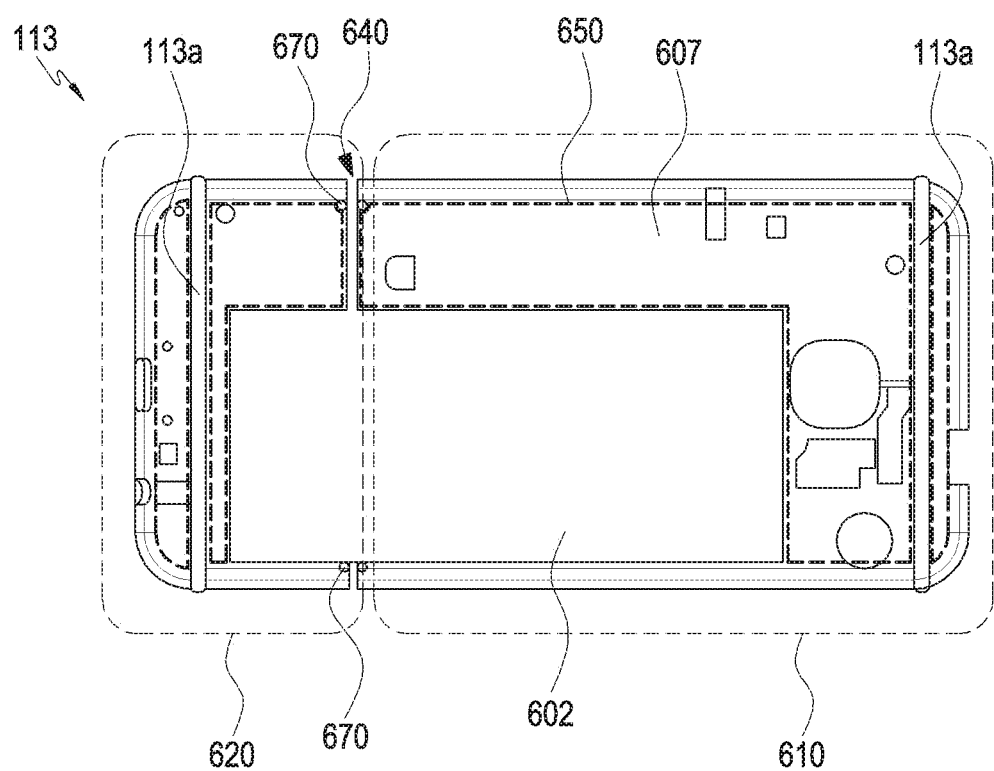
FIG. 8 is a view illustrating a part (an insulating part) of a housing of an electronic device according to various embodiments of the present invention.
Figure 9:
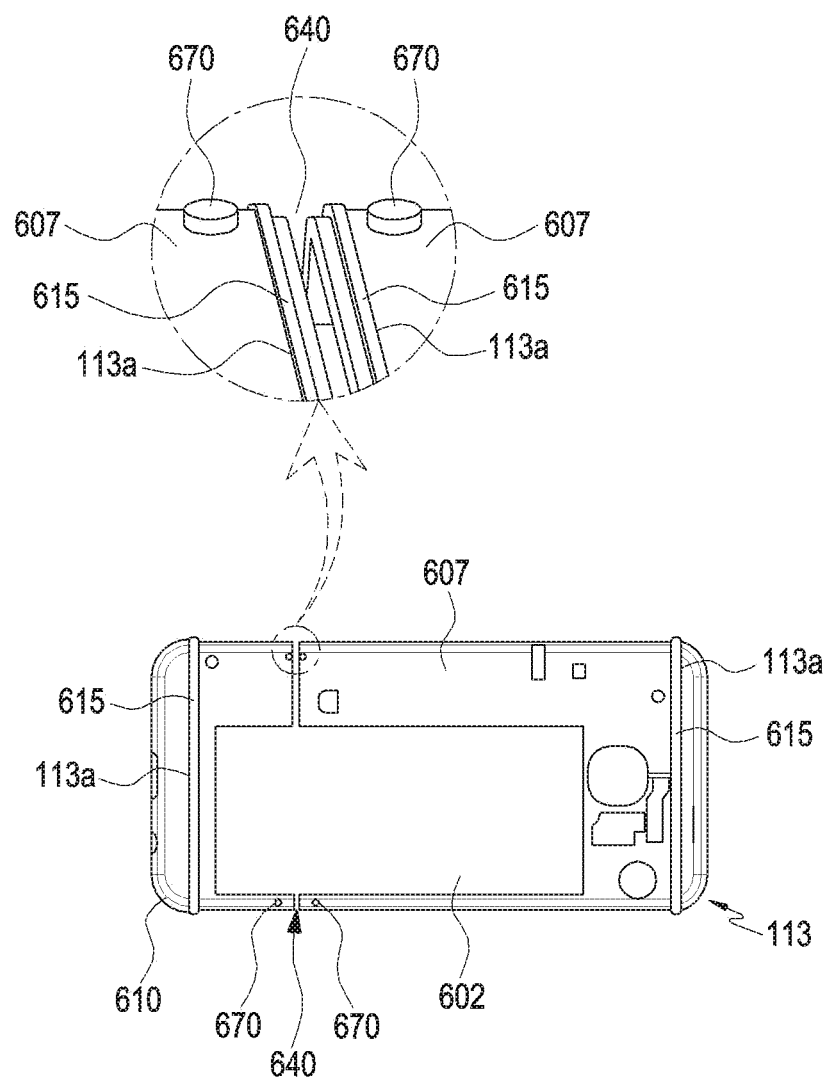
FIG. 9 is a view illustrating one surface (a surface contacting a metal part) of a part (an insulating part) of a housing of an electronic device according to various embodiments of the present invention.

FIG. 8 is a view illustrating a part (an insulating part) of a housing of an electronic device according to various embodiments of the present invention. FIG. 9 is a view illustrating one surface (a surface contacting a metal part) of a part (an insulating part) of a housing of an electronic device according to various embodiments of the present invention. It is noted that the structure shown in FIGS. 8 and 9 only regards the shape of the insulating part 113. FIGS. 1, 2, 3, 4, 5, 6, and 7 may be referred to for, e.g., the metal part mentioned for the description of the insulating part 113.

Referring to FIGS. 8 and 9, according to various embodiments, the insulating part 113 may be provided on the inner surface of the metal part (refer to 111 of FIGS. 5, 6, and 7), e.g., on the inner surfaces of the first metal member (refer to 510 of FIGS. 5, 6, and 7) and the second metal members (refer to 520 of FIGS. 5 to 7) and between the first metal member 510 and the second metal members 520, e.g., in the segmenters (111*d* of FIGS. 5, 6, and 7). According to an embodiment, the insulating part 113 may be formed of a non-conductive material, e.g., synthetic resin. According to an embodiment, the insulating part 113 may be formed separately from the metal part 111 and be then attached to the first metal member 510 and the second metal members 520.

According to various embodiments, the insulating part 113 may be divided into two non-metallic members 610 and 620 at a segmenting portion 640 along the width direction of the electronic device. As the insulating part 113 is segmented into two non-metallic members 610 and 620, the respective coupling positions of the two non-metallic members 610 and 620 for the first metal member 510 and the second metal members 520 may easily be adjusted. For example, although the metal members (e.g., the first metal member 510 and second metal members 520 of FIGS. 5, 6, and 7) actually manufactured and the non-metallic members 610 and 620 each have a predetermined manufacturing tolerance, the non-metallic extension part 113*a* may be smoothly seated and assembled in the segmenter 530. The configuration of the insulating part 113 and the metal part 111 which are smoothly seated and assembled is described in greater detail with reference to FIG. 14.

The non-metallic extension part 113*a* may be formed in at least one of, e.g., the two non-metallic members 610 and 620. The non-metallic extension part 113*a* may be disposed in a space, e.g., the segmenter 111*d*, between the first metal member 510 and the second metal member 520. The non-metallic extension part 113*a* may be disposed in the segmenter 111*d* to electrically insulate the first metal member 510 and the second metal member 520. The non-metallic extension part 113*a* may form a third outer surface 615 which faces in the second direction through the segmenter 111*d*.

According to an embodiment, in a case where the segmenters 111*d* are positioned above and below the first metal member 510, the segmenting portion 640 of the insulating part 113 may be disposed between the upper segmenter 111*d* and the lower segmenter 111*d* of the first metal member 510.

According to an embodiment, the insulating part 113 may be attached and combined with the metal part 111. One surface of the insulating part 113 may be provided as a contact surface 607 which faces, and is attached to, the inner surface of the first metal member 510 and the inner surface of the second metal member 520. According to various embodiments, the non-metallic extension part 113*a* may be projected from the contact surface 607 of at least one of the non-metallic members 610 and 620. According to various embodiments, a guide part 670 corresponding to the position setting part (refer to 536 of FIGS. 5, 6, and 7) may be provided on the contact surface 607.

According to an embodiment, the guide part 670 may be formed as a guide protrusion that projects from the contact surface 607. The guide protrusion may be seated in the position setting part (536 of FIGS. 5, 6, and 7) formed as a long hole. If the guide protrusion is seated in the long hole, the guide protrusion may be linearly moved in the long hole (e.g., linear movement along the third or fourth direction). As the guide protrusion linearly moves in the long hole, when the metal part 111 and the insulating part 113 are coupled together, linear movement (e.g., linear movement along the third or fourth direction) of the non-metallic members 610 and 620 on the first metal member 510 and the second metal members 520 may be permitted. The configuration and operation of a combination of the metal part 111 and the insulating part 113 are described in detail with reference to FIGS. 14 and 15.

According to an embodiment, projecting ribs 650 may be formed on the contact surfaces 607 of the non-metallic members 610 and 620. The projecting ribs 650 may be formed and arrayed along the edges of the contact surfaces 607 of the non-metallic members 610 and 620. In some embodiments, a projecting rib 650 may be formed in a loop along the edge of the contact surface 607 or multiple projecting ribs 650 may be arrayed to form a loop trajectory along the edge of the contact surface 607. A coupling member may be disposed in the area or space(s) (e.g., the contact surface 607) surrounded by the projecting rib 650. The projecting rib 650 may be formed to surround the area where the coupling member is disposed. As the projecting ribs 650 support the respective edges of the first metal member 510 and the second metal members 520, the metal members may be prevented from sagging or warping in the first direction. The configuration of the coupling member is described in greater detail with reference to FIGS. 10 and 11.

According to various embodiments, the insulating part 113 may further include a structure for fastening or coupling the support plate (e.g., 125 of FIG. 1) or the printed circuit board (e.g., 123 of FIG. 1).

Figure 10:
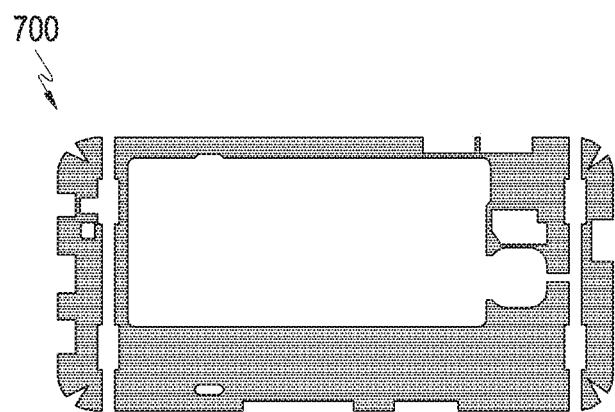
FIG. 10 is a view illustrating a part (a coupling member) of a housing of an electronic device according to various embodiments of the present invention.
Figure 11:
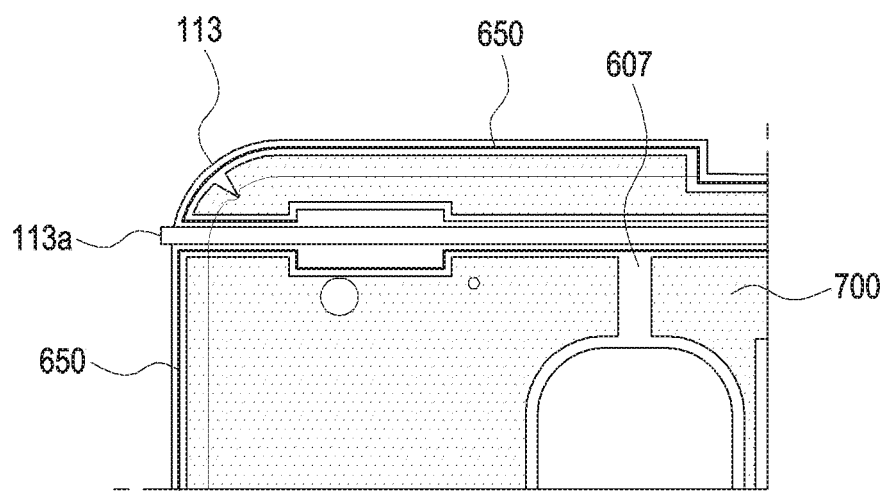
FIG. 11 is a partial view illustrating a state in which parts (an insulating part and a coupling member) of a housing are coupled together in an electronic device according to various embodiments of the present invention.
Figure 12:
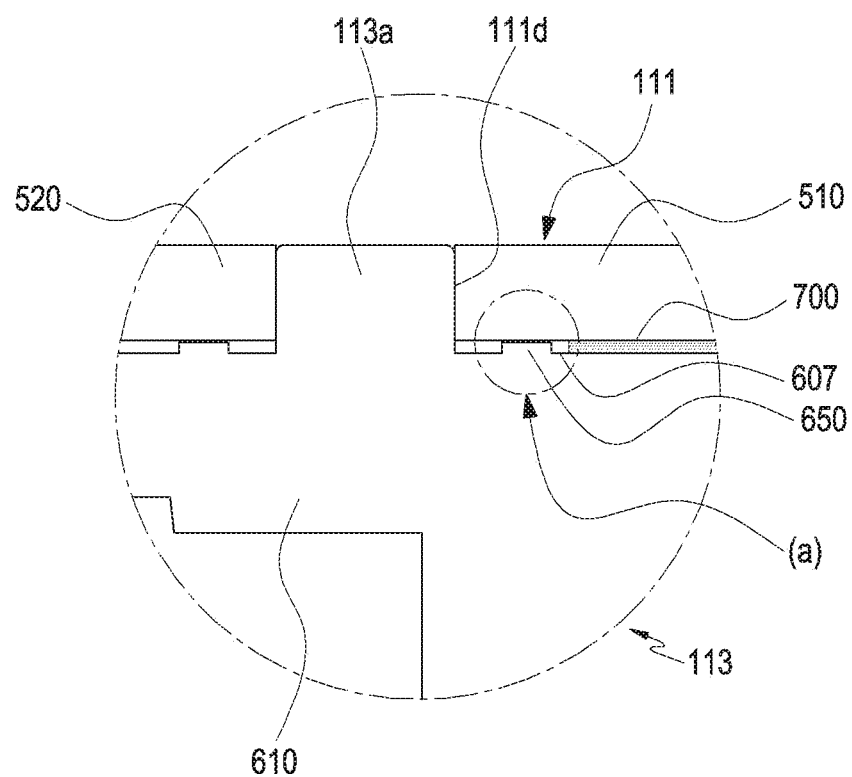
FIG. 12 is a partial cross-sectional view illustrating a state in which a metal part and an insulating part are coupled in a segment in an electronic device according to various embodiments of the present invention.
Figure 13:
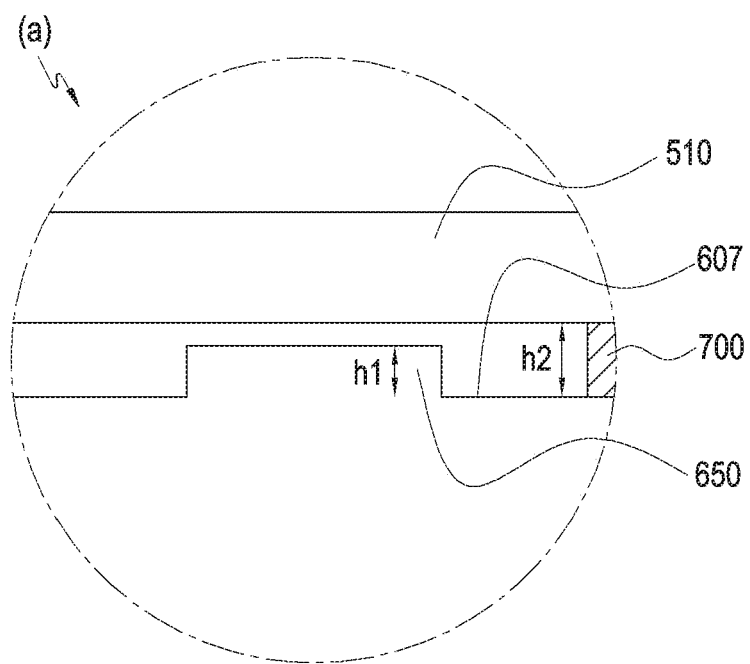
FIG. 13 is an enlarged view of portion (a) of FIG. 12 in an electronic device according to various embodiments of the present invention.

FIG. 10 is a view illustrating a part (a coupling member) of a housing of an electronic device according to various embodiments of the present invention. FIG. 11 is a partial view illustrating a state in which parts (an insulating part and a coupling member) of a housing are coupled together in an electronic device according to various embodiments of the present invention. FIG. 12 is a partial cross-sectional view illustrating a state in which a metal part and an insulating part are coupled in a segment in an electronic device according to various embodiments of the present invention. FIG. 13 is an enlarged view of portion (a) of FIG. 12 in an electronic device according to various embodiments of the present invention.

Referring to FIGS. 10, 11, 12, and 13, according to various embodiments, the coupling member 700 may be provided between the metal part 111 and the insulating part 113. The first metal member 510 and the second metal member 520 may be attached and coupled to the insulating part 113 via the coupling member 700. According to an embodiment, the coupling member 700 may be separated into a plurality of pieces each of which corresponds to a respective one of the contact surfaces 607 of the non-metallic members 610 and 620. For example, the coupling member 700 may be disposed in the area or space(s) (e.g., the contact surface 607) surrounded by the projecting rib 650 which forms the loop of the insulating part 113. According to an embodiment, the coupling member 700 may include a thermal attaching tape.

According to various embodiments, the projecting rib 650 formed on the contact surface 607 of the insulating part 113 may be formed with a thickness h1 smaller than the thickness h2 of the coupling member 700 attached onto one side of the insulating part 113. For example, the thickness of the projecting rib 650 may be about 70% to about 80% of the thickness of the coupling member 700.

The coupling member 700 may be provided to be smaller than the area of the contact surface 607 or the area where the metal part 111 and the insulating part 113 face each other. For example, although the coupling member 700 is disposed in substantially the overall area of the facing surfaces of the metal part 111 and the insulating part 113 (e.g., the inner surface of the metal part 111 and the contact surface 607 of the insulating part 113), an empty space where the coupling member 700 is not disposed may be formed at the edges of the facing surfaces. For example, if the coupling member 700 is formed up to the end of the contact surface 607, the coupling member 700 may be floated or agape from the contact surface 607 of the insulating part 113, and the coupling member 700 may be exposed to the outside.

As set forth above, the placement of the projecting rib 650 which forms an empty space where the coupling member 700 is not disposed at the edge of the surface (e.g., the inner surface of the metal part 111 and the contact surface 607 of the insulating part 113) where the metal part 111 and the insulating part 113 face each other or projects about 70% to about 80% of the thickness of the coupling member 700 may prevent the coupling member 700 from floating or opening on the contact surface 607 and prevent the coupling member 700 from exposure to the outside, thereby giving a better look to the second plate 101b or housing.

Figure 14:
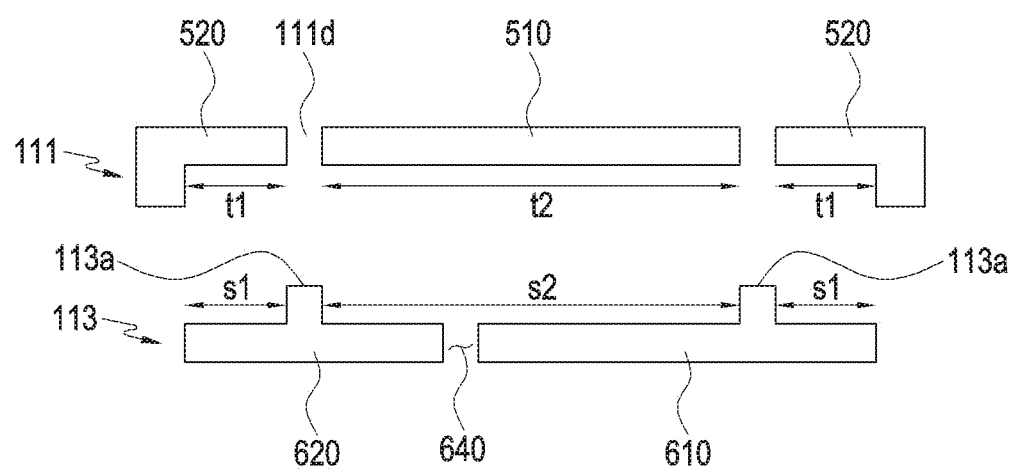
FIG. 14 is an exploded cross-sectional view illustrating a coupling structure of parts (a metal part and an insulating part) of a housing of an electronic device according to various embodiments of the present invention.

FIG. 14 is an exploded cross-sectional view illustrating a coupling structure of parts (a metal part and an insulating part) of a housing of an electronic device according to various embodiments of the present invention.

Referring to FIG. 14, according to various embodiments, the metal part 111 and the insulating part 113 each may be structured with segments. For example, the metal part 111 may be segmented to allow some of the segments to be utilized as an antenna member, and the insulating part 113 may be segmented for an easier attaching to the metal part 111.

According to an embodiment, although the first metal member 510, the second metal members 520, and the insulating part 113 have a dimensional tolerance for easier combination, the parts (e.g., the first metal member 510, the second metal members 520, and the insulating part 113) each may have a manufacturing tolerance during the actual process. In a case where the sum of the manufacturing tolerances of the parts exceeds the sum of the dimensional tolerances, the parts (e.g., the first metal member 510, the second metal members 520, and the insulating part 113) may not be easy to combine or, although combined, gaps may be externally caused between the parts (e.g., gaps (in the combined state) due to the manufacturing tolerances of the parts regarding the distance between t1 and t2, the distance between t1 and t2, and the distance between s1 and s2).

According to various embodiments of the present invention, as the insulating part 113 is formed of a combination of the plurality of non-metallic members 610 and 620, gaps may be suppressed from externally occurring when the insulating part 113 is combined with the first metal member 510 and/or the second metal members 520. For example, in the state where the insulating part 113 is not segmented, if t2 of the parts actually manufactured is larger than s2, the non-metallic extension part 113a may fail to smoothly sit on the segmenter 530. In another example, if t2 of the parts actually produced is smaller than s2, with the insulating part 113 not segmented, a gap may be formed between the first metal member 510 and the non-metallic extension part 113a. The gap occurring between the non-metallic extension part 113a and the segmenter 111d may be visible from the outside, deteriorate the outer look of the housing, and cause the housing to be determined as defective. According to various embodiments, as the insulating part 113 is segmented into two non-metallic members 610 and 620, when the insulating part 113 is attached to the metal part 111, each non-metallic extension part 113a may smoothly enter into the segmenter 111d and a gap may be prevented from externally occurring.

Figure 15:
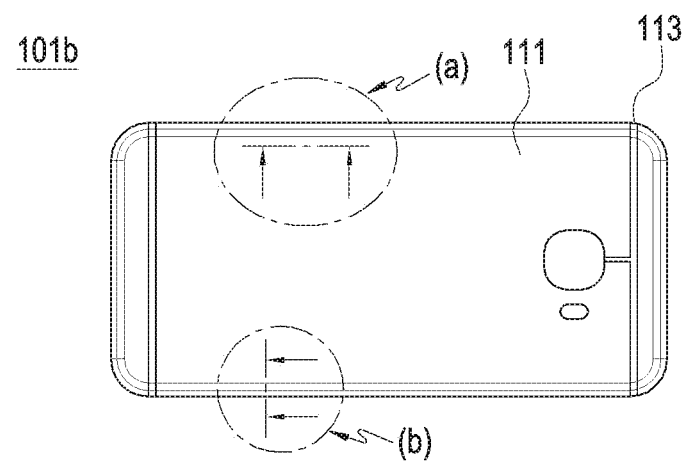
FIG. 15 is a view illustrating a state in which a metal part and an insulating part are coupled together in an electronic device according to various embodiments of the present invention.
Figure 15:
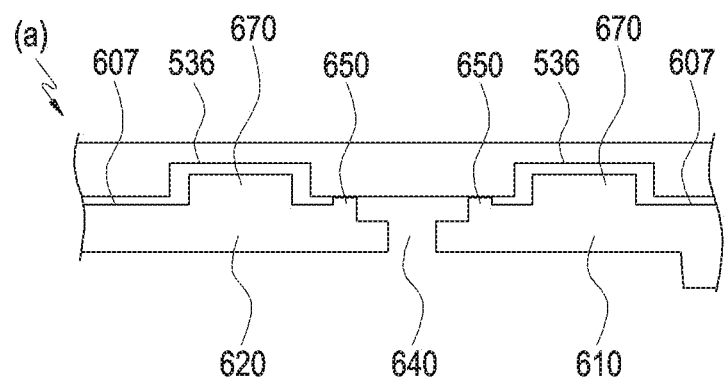
Figure 15:
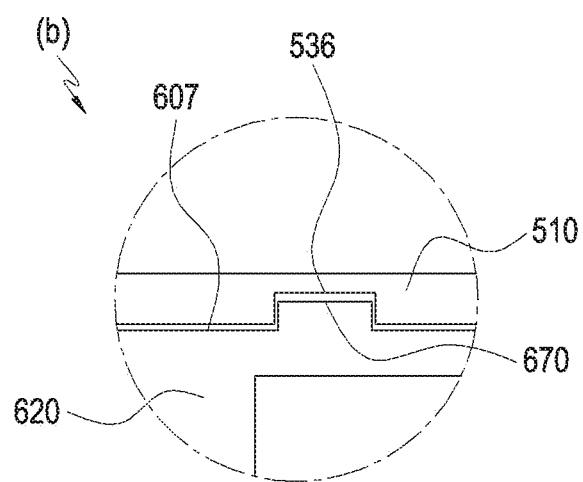

FIG. 15 is a view illustrating a state in which a metal part and an insulating part are coupled together in an electronic device according to various embodiments of the present invention.

Referring to FIG. 15, as set forth above, for combination of the metal part 111 and the insulating part 113, the insulating part 113 may be separated into a plurality of non-metallic members 610 and 620, and the guide part 670 corresponding to the position setting part 536 may be provided on the contact surface 607, and the position setting part 536 may be provided in the metal part 111. The position setting part 536 and the guide part 670 may set a coupling position of the insulating part 113 for the first metal member 510 and the second metal member 520. According to an embodiment, the guide part 670 may be formed as a guide protrusion which projects from the contact surface 607. The position setting parts 536 may be formed as long holes incised in the inner surfaces of the first metal member 510 and the second metal members 520, and the guide protrusions may be seated in the long holes. According to an embodiment, the long hole may be an elongated hole along the third (or fourth) direction and be engaged with the guide protrusion along the fifth (or sixth) direction. As the position setting part 536 is formed as a long hole along the third or fourth direction and is engaged with the guide protrusion along the fifth or sixth direction, if the guide protrusion is seated in the long hole, the guide protrusion may be moved in the long hole along the third (or fourth) direction while tightly engaged without movement along the fifth (or sixth) direction. With the segmented structure of the insulating part 111 and as the guide part fits into the long hole which is formed long along the third (or fourth) direction and engaged with the guide protrusion along the fifth (or sixth) direction, the non-metallic members 610 and 620 may be linearly moved within a predetermined range in the third (or fourth) direction on the first metal member 510 and/or the second metal member 520 and be engaged tightly in the fifth (or sixth) direction. Thus, the non-metallic members 610 and 620 may adjust gaps which may be caused due to the manufacturing tolerances of the first metal member 510 and the second metal member 520 (in the combined state), and the side surfaces of the non-metallic members 610 and 620 may be brought in tight contact with the metal members 510 and 520.

Figure 16:
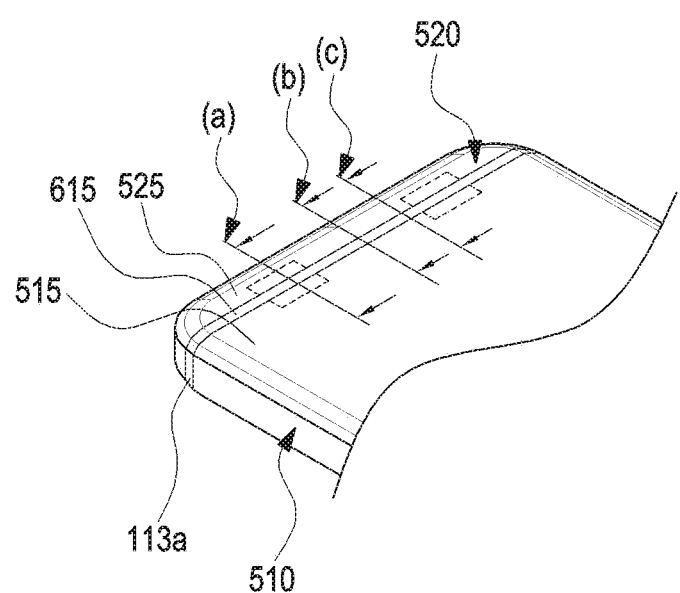
FIG. 16 is a partial perspective view illustrating a state in which parts (a metal part and an insulating part) of a housing are coupled together in an electronic device according to various embodiments of the present invention.
Figure 17:
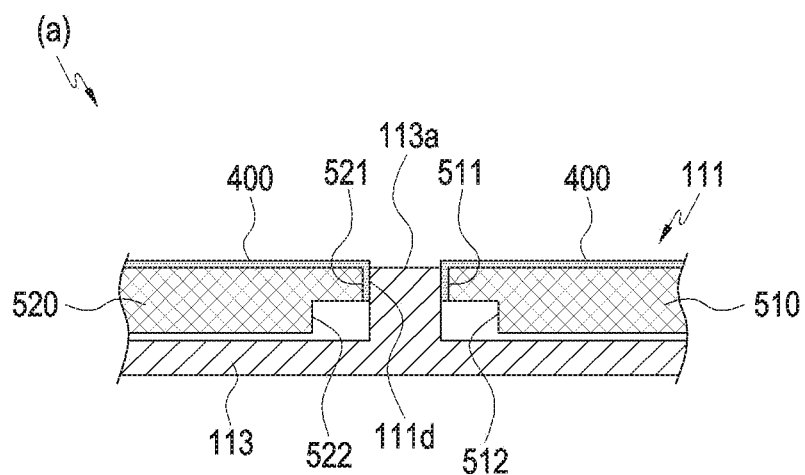
FIG. 17 is a cross-sectional view of a housing, taken along line (a) of FIG. 16 in an electronic device according to various embodiments of the present invention.
Figure 18:
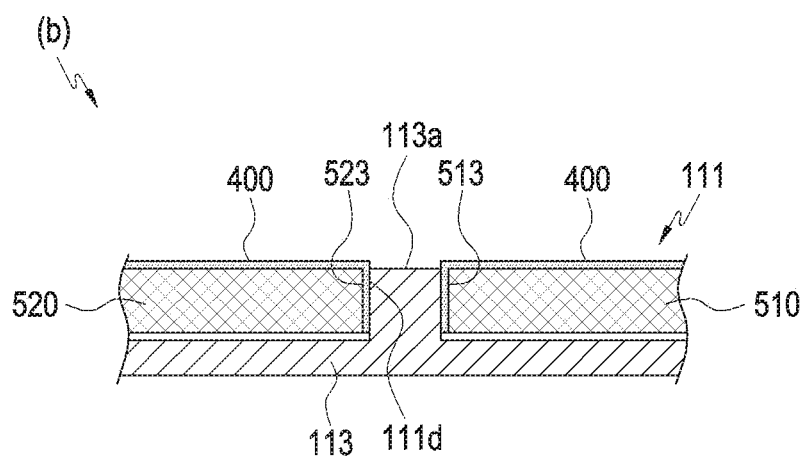
FIG. 18 is a cross-sectional view of a housing, taken along line (b) of FIG. 16 in an electronic device according to various embodiments of the present invention.
Figure 19:
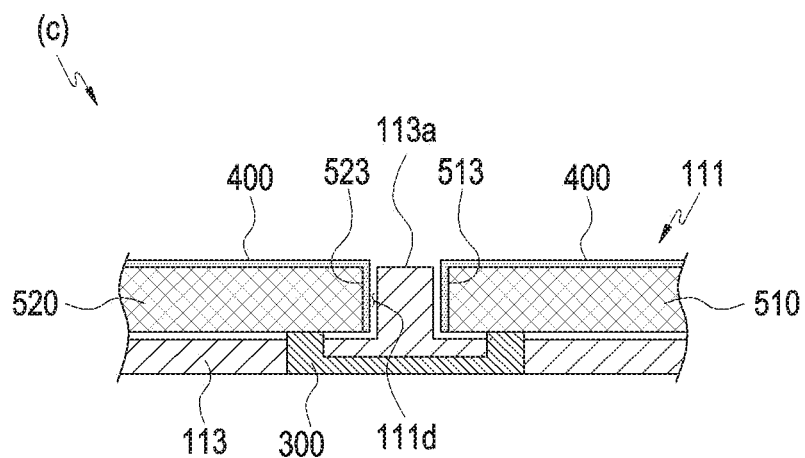
FIG. 19 is a cross-sectional view of a housing, taken along line (c) of FIG. 16 in an electronic device according to various embodiments of the present invention.

FIG. 16 is a partial perspective view illustrating a state in which parts (a metal part and an insulating part) of a housing are coupled together in an electronic device according to various embodiments of the present invention. FIG. 17 is a cross-sectional view of a housing, taken along line (a) of FIG. 16 in an electronic device according to various embodiments of the present invention. FIG. 18 is a cross-sectional view of a housing, taken along line (b) of FIG. 16 in an electronic device according to various embodiments of the present invention. FIG. 19 is a cross-sectional view of a housing, taken along line (c) of FIG. 16 in an electronic device according to various embodiments of the present invention.

Referring to FIGS. 16, 17, 18, and 19, as set forth above, the insulating part 113, e.g., the non-metallic extension part 113a, may be disposed in the segmenter 111d between the first metal member 510 and the second metal member 520. According to an embodiment, the first metal member 510 and the second metal member 520, respectively, may include first side parts 511, 512, and 513 and second side parts 521, 522, and 523 which face each other with the non-metallic extension part 113a disposed therebetween in the segmenter 111d. According to an embodiment, the first side parts 511, 512, and 513 may be provided to face the insulating part 113 (e.g., the non-metallic extension part 113a) in the third direction of the first metal member 510. The second side parts 521, 522, and 523 may be provided to face the insulating part 113 (e.g., the non-metallic extension part 113a) and the first side parts 511, 512, and 513 in the fourth direction of the second metal member 520.

According to various embodiments, the first side parts 511, 512, and 513 may be divided into a first area 511 or 513 and a second area 512. The oxidized layer 400 may be formed in the first area 511 or 513 of the first side parts 511, 512, and 513. The base material of the first metal member 510 may be exposed at the second area 512 of the first side parts 511, 512, and 513, and the second area 512 may lack the oxidized layer 400.

According to various embodiments, the second side parts 521, 522, and 523 may be divided into a first area 521 or 523 and a second area 522. The oxidized layer 400 may be formed in the first area 521 or 523 of the second side parts 521, 522, and 523. The base material of the second metal member 520 may be exposed at the second area 522 of the second side parts 521, 522, and 523, and the second area 522 may lack the oxidized layer 400.

As described below, according to various embodiments of the present invention, in the process of forming the metal part 111, the first metal member 510 and the second metal member 520 may be anodized while connected via a bridge member and, after anodizing, the bridge member may be removed.

Before the bridge member is removed, the oxidized layer 400 may be formed around the bridge member (corresponding to the first area 511 or 513 of the first metal member 510 and the first area 521 or 523 of the second metal member 520) in the first metal member 510 and the second metal member 520. The bridge member may be removed after the oxidized layer 400 is formed on the first metal member 510 and the second metal member 520. The bridge member-removed portions (corresponding to the second area 512 of the first metal member 510 and the second area 522 of the second metal member 520) of the first metal member 510 and the second metal member 520 may lack the oxidized layer 400. The structure of the oxidized layer 400 included in the first side parts 511, 512, and 513 and the second side parts 521, 522, and 523 is described in detail with reference to FIGS. 26, 27, 28 and 29.

Figure 20:
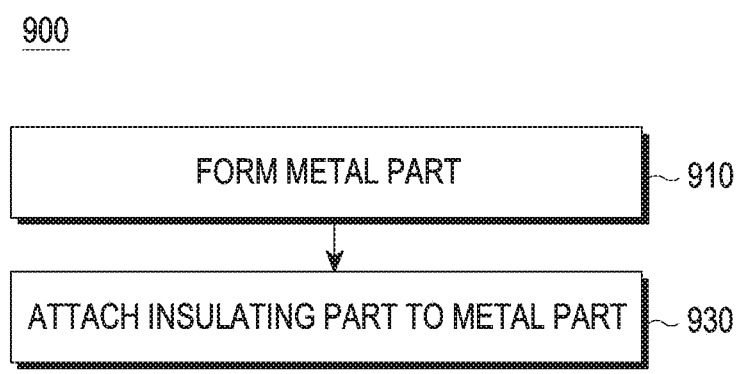
FIG. 20 is a flowchart schematically illustrating a method of manufacturing a housing of an electronic device according to various embodiments of the present invention.

According to various embodiments, the segmenter 111d may further include a member 300 for electrically connecting the first metal member 510 and the second metal member 520 (FIG. 20). According to an embodiment, the member 300 may include a conductive material.

Described below is a method of manufacturing the above-described housing, e.g., the second plate, of the electronic device.

In the following embodiments, the components similar to those in the above embodiments or easy to understand from the description of the above embodiments are denoted with or without the same reference numerals and their detailed description may be skipped.

Figure 21:
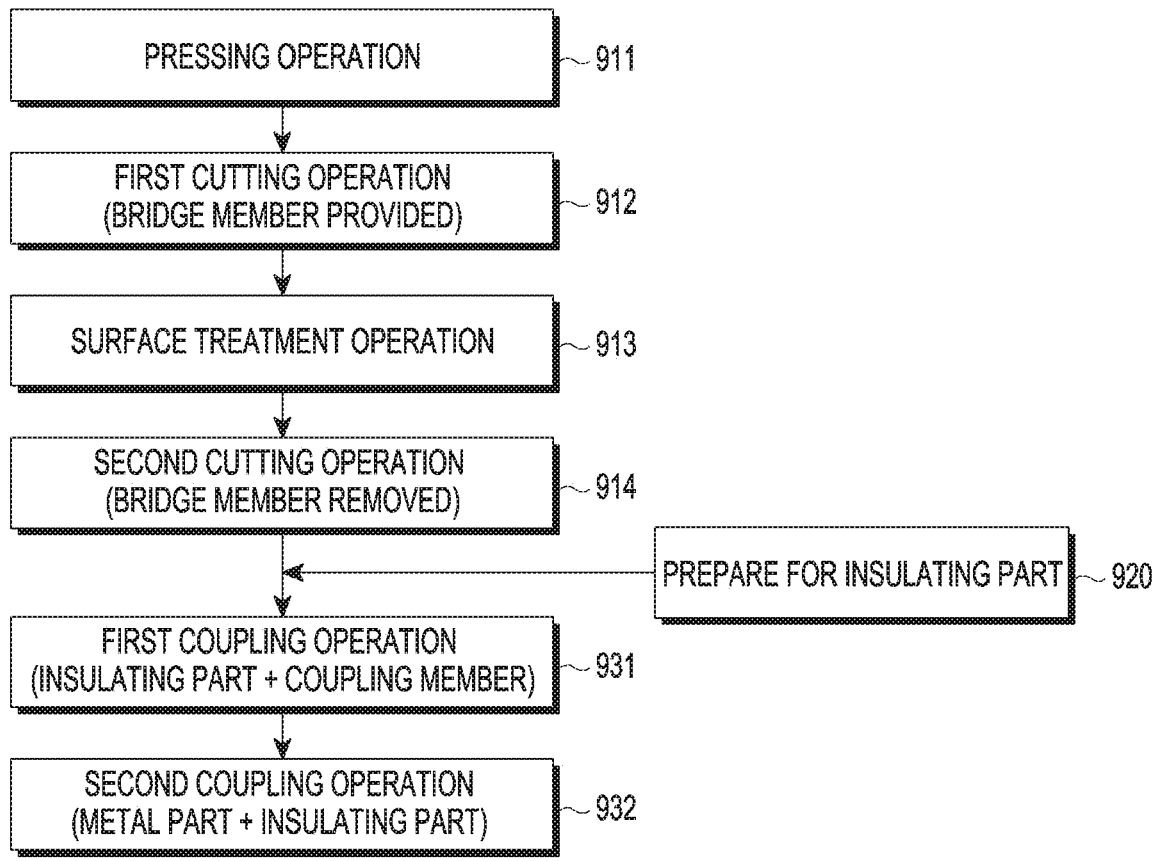
FIG. 21 is a flowchart illustrating a method of manufacturing a housing of an electronic device according to various embodiments of the present invention.

FIG. 20 is a flowchart schematically illustrating a method of manufacturing a housing of an electronic device according to various embodiments of the present invention. FIG. 21 is a flowchart illustrating a method of manufacturing a housing of an electronic device according to various embodiments of the present invention.

Figure 29:
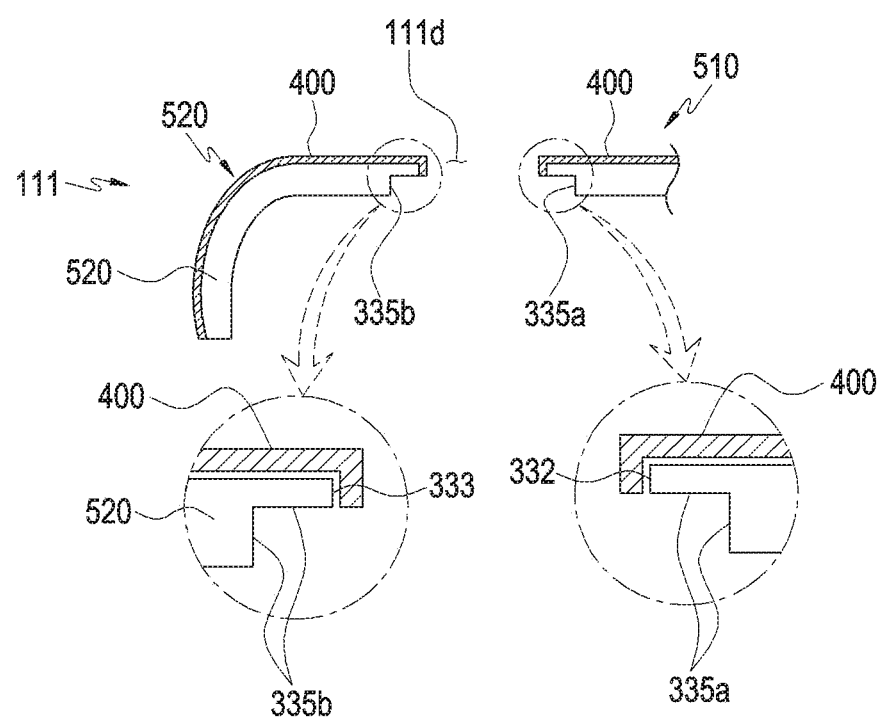
FIG. 29 is a cross-sectional view illustrating a metal part formed by a second cutting operation in a method of manufacturing a housing of an electronic device according to various embodiments of the present invention.

Referring to FIGS. 29 and 30, according to various embodiments, the second plate (refer to 101b of FIG. 1) may include the operation 910 of forming the metal part 111 and the operation 930 of attaching the insulating part 113 to the metal part 111. According to an embodiment, the operation 910 of forming the metal part 111 may include a pressing operation 911, a first cutting operation 912, a surface treatment operation 913, and a second cutting operation 914. According to an embodiment, the operation 930 of attaching the insulating part 113 to the formed metal part 111 may include coupling operations 931 and 932.

A method of manufacturing the second plate 101b is described below with reference to the drawings individually illustrating the manufacturing method.

Figure 22:
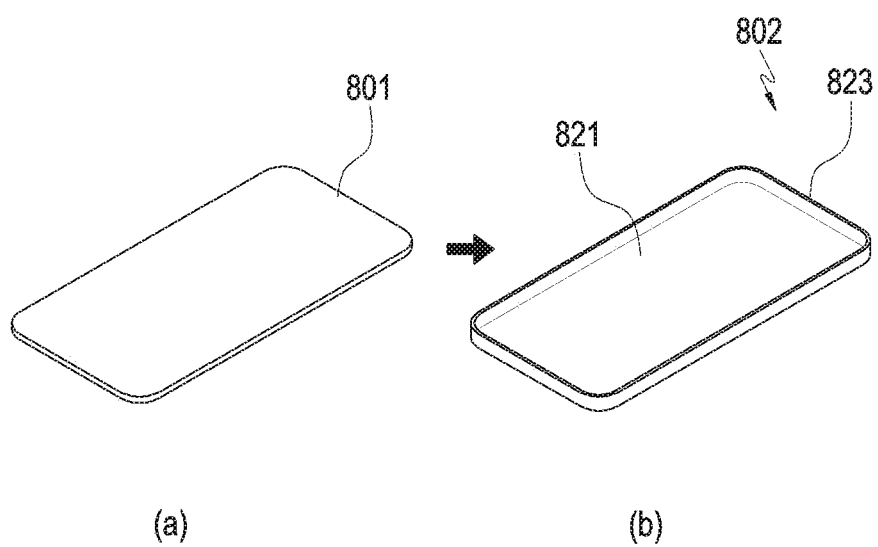
FIG. 22 is a view schematically illustrating a pressing operation in a method of manufacturing a housing of an electronic device according to various embodiments of the present invention.

FIG. 22 is a view schematically illustrating a pressing operation in a method of manufacturing a housing of an electronic device according to various embodiments of the present invention.

Referring to FIG. 22, the pressing operation (refer to 911 of FIG. 21) may form a first treatment member 802 by press-processing a metal sheet or metal plate 801. The pressing operation 911 may make the first treatment member 802 a cuboid with one open surface, which includes, e.g., a bottom plate 821 and a side member 823 with four side walls formed along the edge of the bottom plate 821. In the subsequent process, the bottom plate 821 may be formed into the above-described second plate (e.g., 101b of FIG. 1), and the side member 823 may be formed into the above-described side part (114 of FIG. 1).

Figure 23:
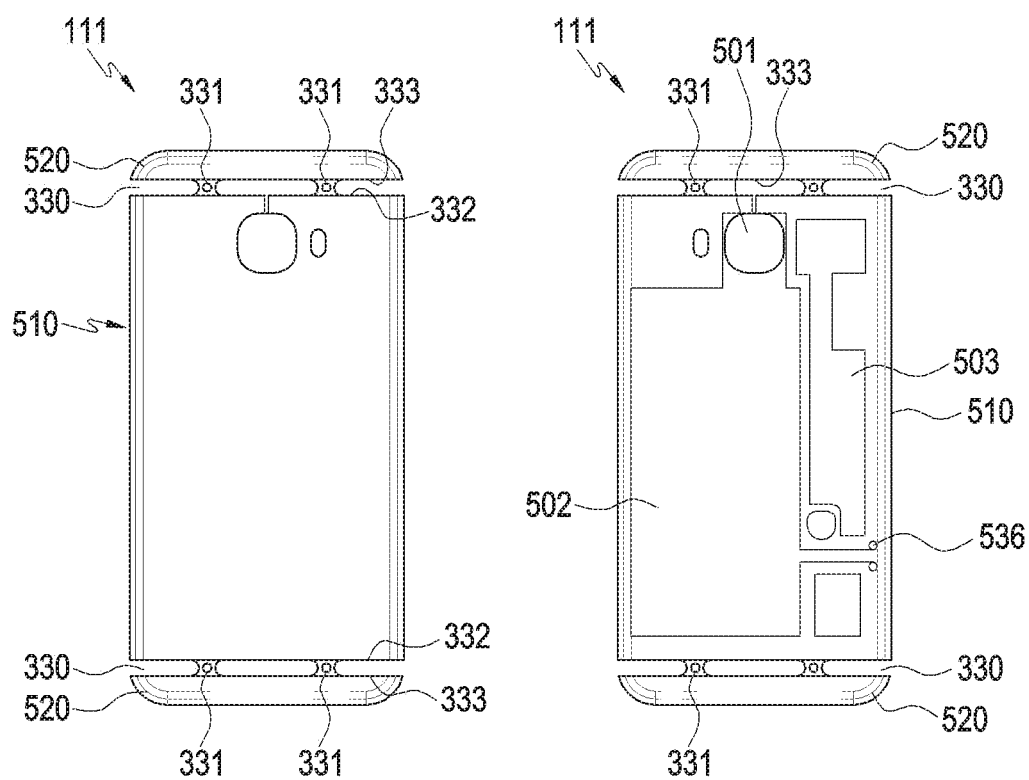
FIG. 23 is a view schematically illustrating a metal part processed in a first cutting operation in a method of manufacturing a housing of an electronic device according to various embodiments of the present invention.
Figure 24:
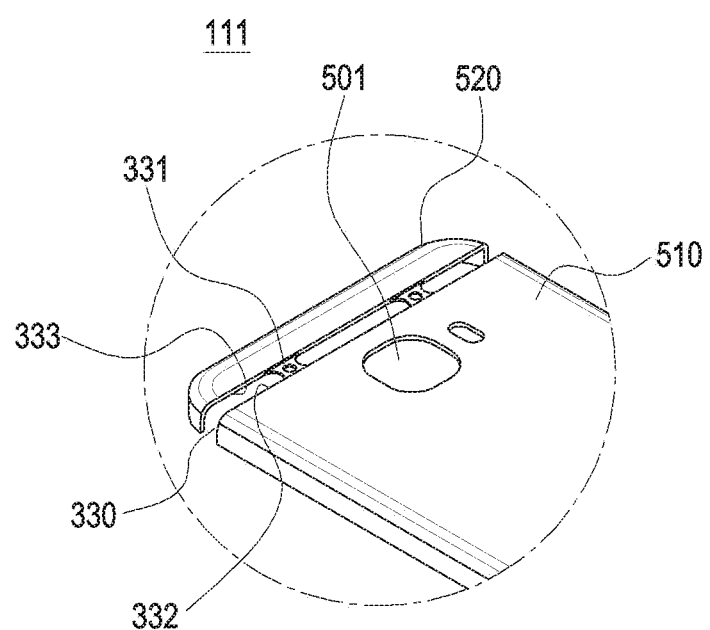
FIG. 24 is a perspective view illustrating a state in which a part (metal part) of a housing is processed to be partially segmented in a method of manufacturing a housing of an electronic device according to various embodiments of the present invention.

FIG. 23 is a view schematically illustrating a metal part processed in a first cutting operation in a method of manufacturing a housing of an electronic device according to various embodiments of the present invention. FIG. 24 is a perspective view illustrating a state in which a part (metal part) of a housing is processed to be partially segmented in a method of manufacturing a housing of an electronic device according to various embodiments of the present invention.

Figure 25:
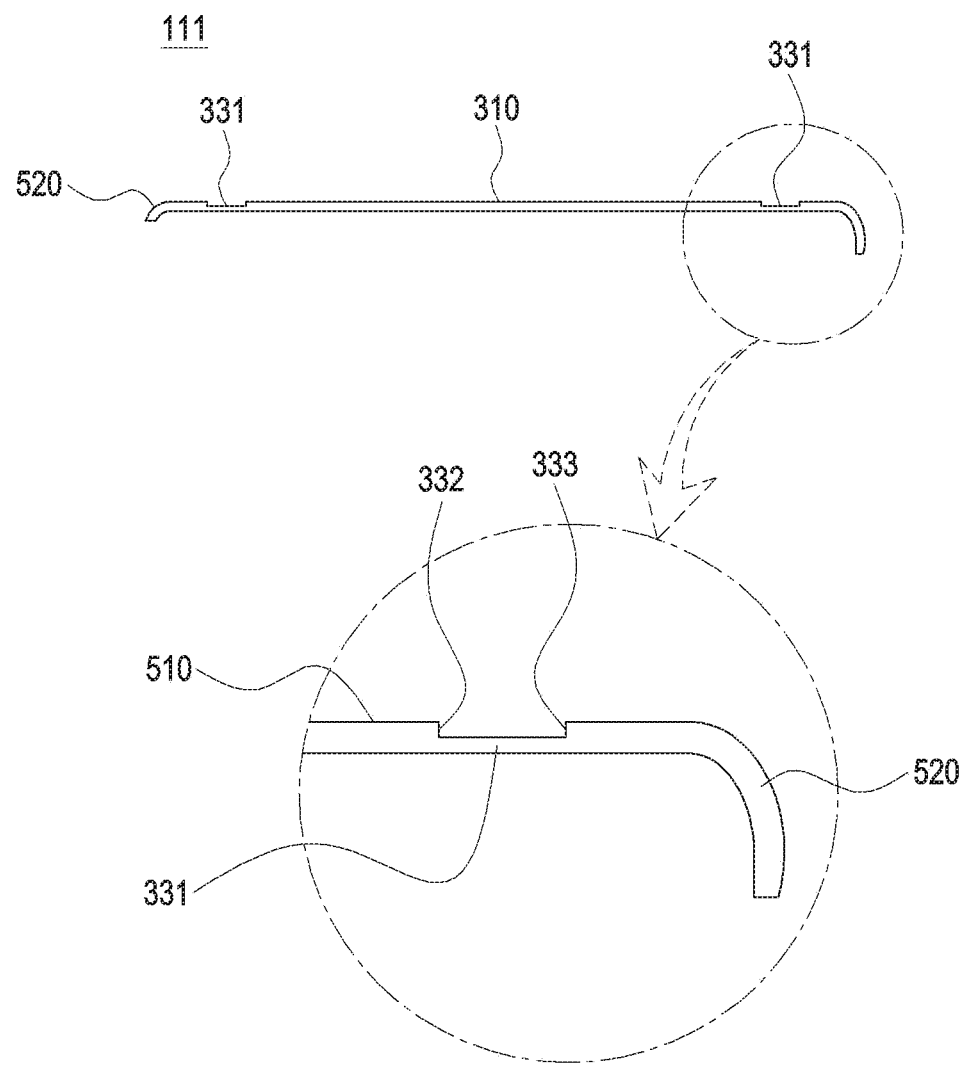
FIG. 25 illustrates a side cross-sectional view and a partially enlarged view illustrating a state in which a part of a housing is processed to be partially segmented in a method of manufacturing a housing of an electronic device according to various embodiments of the present invention.

FIG. 25 illustrates a side cross-sectional view and a partially enlarged view illustrating a state in which a part of a housing is processed to be partially segmented in a method of manufacturing a housing of an electronic device according to various embodiments of the present invention.

Referring to FIGS. 23, 24, 25, according to various embodiments, the first cutting operation 912 may include computer numerical control (CNC) processing. The first cutting operation (refer to 912 of FIG. 21) may form at least one notch(es) or hole(s) 502 and 503 in the first treatment member 802, e.g., the bottom plate 821 and/or the side member 823. For example, the first cutting operation 912 may form holes 502 and 503 for receiving a battery (e.g., 127 of FIG. 1) or a printed circuit board (123 of FIG. 1) by cutting off part of the bottom plate 821 and thus partially reducing the thickness and may form position setting parts 536 which are shaped as long holes to guide or set the position of coupling with the insulating part (113 of FIG. 1).

According to an embodiment, the first cutting operation 912 may segment a portion of the first treatment member 802 from the rest. In a case where the first treatment member 802 is processed to be segmented into the first metal member 510 and the second metal member 520, a partial segmenter 330 including a bridge member 331 may be formed between the first and second metal members 510 and 520 so that the two metal members, i.e., the first and second metal members 510 and 520, together may be subject to surface treatment. For example, the first and second metal members 510 and 520 may be segmented at the partial segmenter 330 while connected together via the bridge member 331. The bridge member 331, after the surface treatment operation 913, may be completely removed by the second cutting operation 914.

According to an embodiment, the bridge member 331 may be formed in the partial segmenter 330 as a predetermined portion of the metal part 111 which is in the state of the first treatment member (802 of FIG. 22) is not cut off. According to an embodiment, the bridge member 331 may be formed to be stepped from the surface (e.g., the outer surface) of the first treatment member 802 to have a thickness smaller than a thickness (as measured along the first direction and/or the second direction) of the first treatment member 802. For example, the metal sheet or metal plate 801 used for the electronic device, e.g., a portable terminal, may be about 1.0 mm thick, and the step where the bridge member 331 is formed by the first cutting operation 912 may be minimally 0.2 mm high. According to an embodiment, a hole may be formed through the bridge member 331 to hold the metal part 111 in the surface treatment operation 913.

In another embodiment, after the first metal member 510 and the second metal member 520 are completely separated (e.g., after the bridge member 331 is removed), the first metal member 510 and the second metal member 520 may be combined with the insulating part 113. Thereafter, when the first metal member 510 and the second metal member 520 need to be electrically connected together, a separate member (refer to 300 of FIG. 19), such as an electrical conductor, may be placed to electrically connect the first metal member 510 and the second metal member 520.

According to an embodiment, cut surfaces 332 and 333 which face each other at the partial segmenter 330 may be formed in the first metal member 510 and the second metal member 520 by the first cutting operation 912. According to an embodiment, the cut surface 332 of the first metal member 510 may form the first area 511 or 513 where the oxidized layer 400 is formed in the first side parts (511, 512, and 513 of FIGS. 17, 18, and 19). According to an embodiment, the cut surface 333 of the second metal member 520 may form the first area 521 or 523 where the oxidized layer 400 is formed in the second side parts (521, 522, and 523 of FIGS. 17, 18, and 19).

Figure 26:
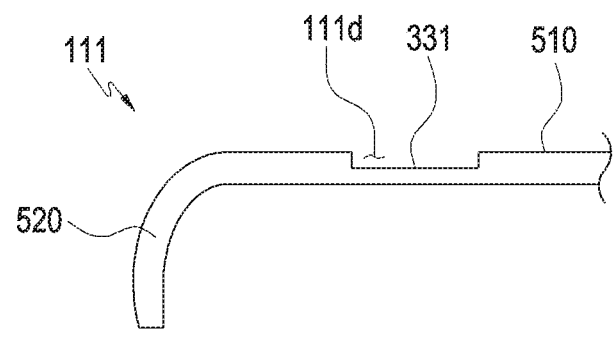
FIG. 26 is a view schematically illustrating a surface treatment operation in a method of manufacturing a housing of an electronic device according to various embodiments of the present invention.
Figure 26:
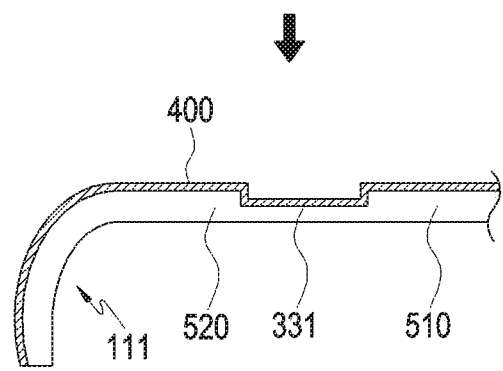

FIG. 26 is a view schematically illustrating a surface treatment operation in a method of manufacturing a housing of an electronic device according to various embodiments of the present invention.

Referring to FIG. 26, the surface treatment operation (refer to 913 of FIG. 21) may perform surface treatment on the metal part (e.g., the first metal member 510 and the second metal member 520 connected by the bridge member 331) formed in the first cutting operation 912.

According to an embodiment, in a case where the metal material is exposed to a hot and humid environment, it may be vulnerable to contamination or corrosion. For example, if the metal part 111 is formed of an aluminum material, the oxidized layer 400 may be formed on the surface of the metal part (e.g., the first metal member 510 and the second metal member 520 connected by the bridge member 331), thus preventing exposure of the aluminum material to the external environment and hence enhancing the surface hardness of the metal part 111. Further, the oxidized layer 400 formed by the surface treatment operation (refer to 913 of FIG. 21) may be colored more easily than the surface of the aluminum material, thus diversifying the color of the second plate 101b.

Since the first metal member 510 and the second metal member 520 stay connected in the surface treatment operation 913, the first metal member 510 and the second metal member 520 together may be placed in the anodizing process, and the oxidized layer 400 may be simultaneously formed on the first metal member 510 and the second metal member 520.

According to an embodiment, if surface treatment (e.g., anodizing) is performed with the first metal member 510 and the second metal member 520 connected together via the bridge member 331, the oxidized layer 400 may be formed on the outer surface of the first metal member 510, the outer surface of the second metal member 520, the outer surface of the bridge member 331, and the cut surface(s) (refer to 332 and 333 of FIGS. 23 and 24).

Figure 27:
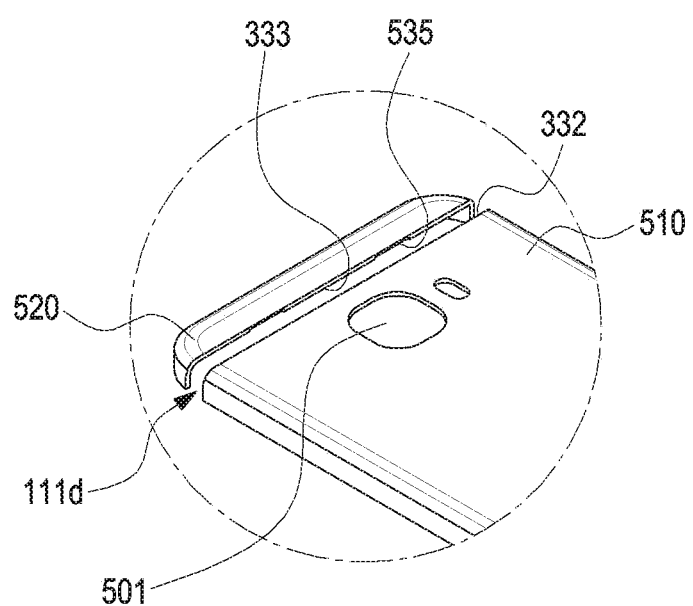
FIG. 27 is a partial perspective view illustrating an outer surface of a metal part formed by a second cutting operation in a method of manufacturing a housing of an electronic device according to various embodiments of the present invention.
Figure 28:
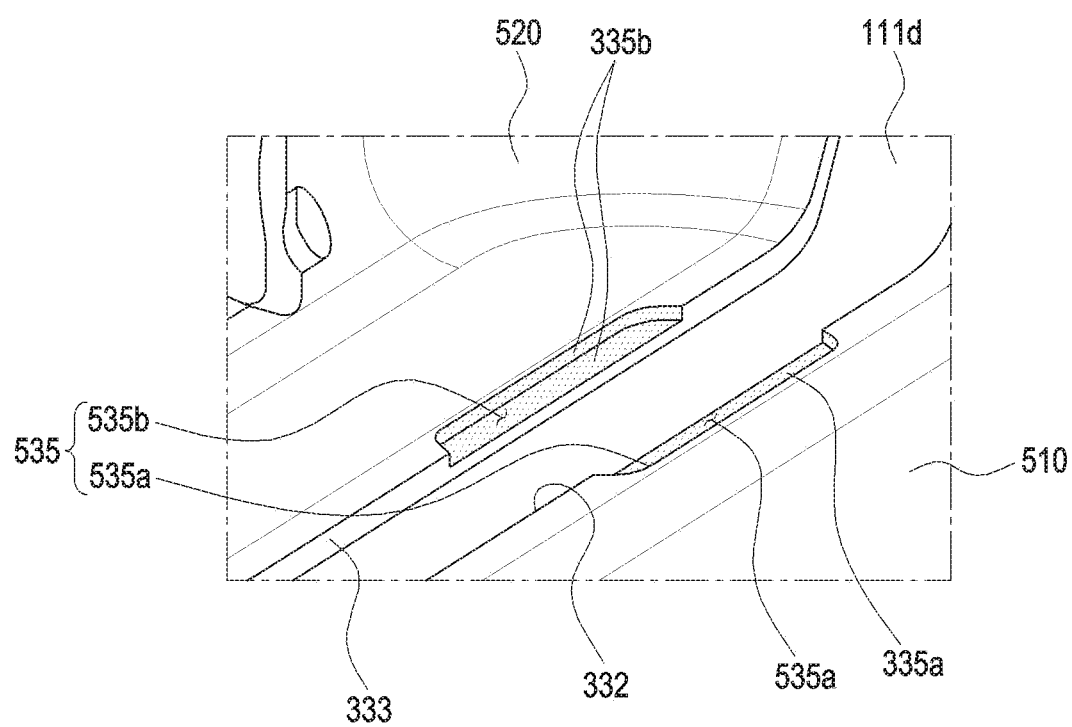
FIG. 28 is a partial perspective view illustrating an inner surface of a metal part formed by a second cutting operation in a method of manufacturing a housing of an electronic device according to various embodiments of the present invention.

FIG. 27 is a partial perspective view illustrating an outer surface of a metal part formed by a second cutting operation in a method of manufacturing a housing of an electronic device according to various embodiments of the present invention. FIG. 28 is a partial perspective view illustrating an inner surface of a metal part formed by a second cutting operation in a method of manufacturing a housing of an electronic device according to various embodiments of the present invention. FIG. 29 is a cross-sectional view illustrating a metal part formed by a second cutting operation in a method of manufacturing a housing of an electronic device according to various embodiments of the present invention.

Referring to FIGS. 27, 28, 29, according to various embodiments, the second cutting operation 914 may be performed by computer numerical control (CNC) processing. By the second cutting operation (refer to 914 of FIG. 21), the bridge member (331 of FIGS. 23 and 26) may be removed from the surface-treated metal part 111, e.g., the partial segmenter (330 of FIGS. 23, 24, 25, and 26), and the first metal member 510 and the second metal member 520 may be completely separated from each other. According to an embodiment, as the bridge member 331 is removed, cut holes 535, 535a, and 535b may be formed in the inner surface of the first metal member 510 and the inner surface of the second metal member 520.

According to an embodiment, after the second cutting operation (refer to 914 of FIG. 21), the first cut surface 335*a* may be formed in the bridge member (331)-removed area in the first metal member 510, and the second cut surface 335*b* may be formed in the bridge member (331)-removed area in the second metal member 520. Since the first cut surface 335*a* and the second cut surface 335*b* are formed with the bridge member 331 removed, the first and second cut surfaces 335*a* and 335*b* may lack the oxidized layer 400. According to an embodiment, the first cut surface 335*a* may form a second area (512 of FIG. 17) which does not include the oxidized layer 400 in the first side parts 511, 512, and 513 of FIGS. 17, 18, and 19) of the first metal member 510. According to an embodiment, the second cut surface 335*b* may form another second area (522 of FIG. 17) which does not include the oxidized layer 400 in the second side parts (521, 522, and 523 of FIGS. 17, 18, and 19) of the second metal member 520.

FIGS. 30A, 30B, 30C, and 30D are views illustrating coupling operations in a method of manufacturing a housing of an electronic device according to various embodiments of the present invention.

Referring to FIGS. 30A, 30B, 30C, and 30D, according to various embodiments, the insulating part 113 may be prepared separately from the metal part 111, with the insulating part 113 separated into two non-metallic members 610 and 620 (refer to 920 of FIG. 21).

According to an embodiment, the coupling operations (931 and 932 of FIG. 21) may attach the insulating part 113 to the first metal member 510 and the second metal member 520 which are disconnected from each other. The coupling operations 931 and 932 may include a first coupling operation (refer to 931 of FIG. 21) to attach the coupling member 700 to one surface of the insulating part 113 and a second coupling operation (refer to 932 of FIG. 21) to attach the first metal member 510 and the second metal member 520 with the insulating part 113 through the coupling member 700.

In the first coupling operation 931, the coupling member 700 may be attached onto the inner flat surface (e.g., contact surface 607 of FIG. 12) of the area or space(s) surrounded by the projecting rib 650.

In the second coupling operation 932, the insulating part 113 and the metal part 111, e.g., the first metal member 510 and the second metal member 520, where the coupling member 700 is attached may be placed on a compression jig(s) 1300 and be compressed at a high pressure and/or high temperature. After the first metal member 510 and the second metal member 520 are aligned with the coupling member (700)-attached insulating part 113, the compression jig(s) 1300 positioned thereabove, thereunder, and therearound may compress the first metal member 510 and the second metal member 520 while adjusting the coupling positions of the two non-metallic members 610 and 620 for the first metal member 510 and the second metal member 520.

Figure 30A:
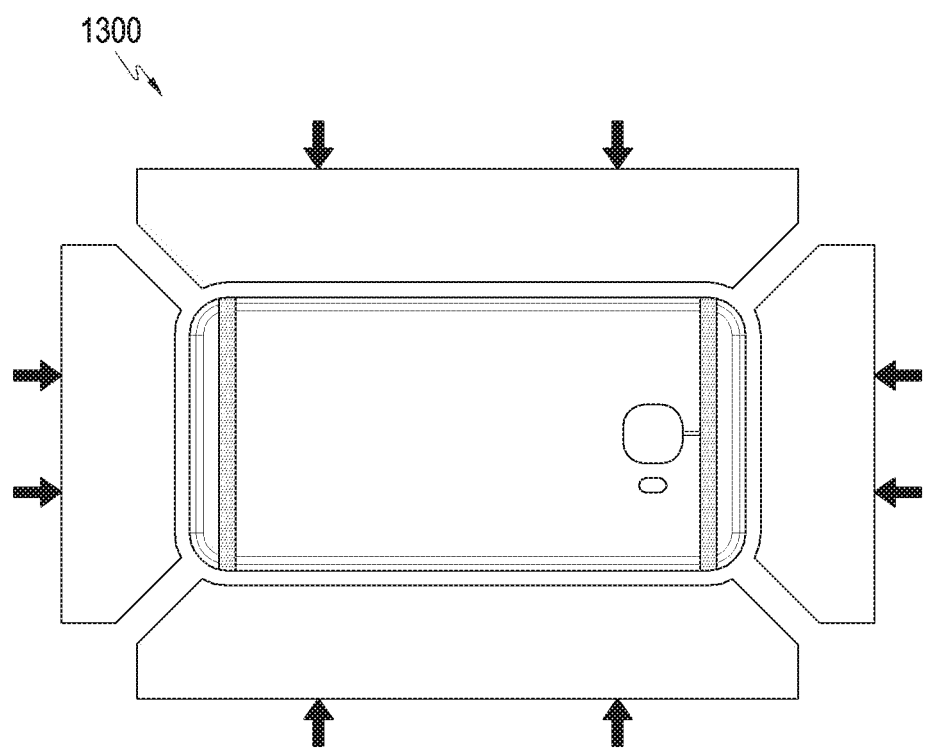
FIGS. 30A, 30B, 30C, and 30D are views illustrating coupling operations in a method of manufacturing a housing of an electronic device according to various embodiments of the present invention.
Figure 30B:
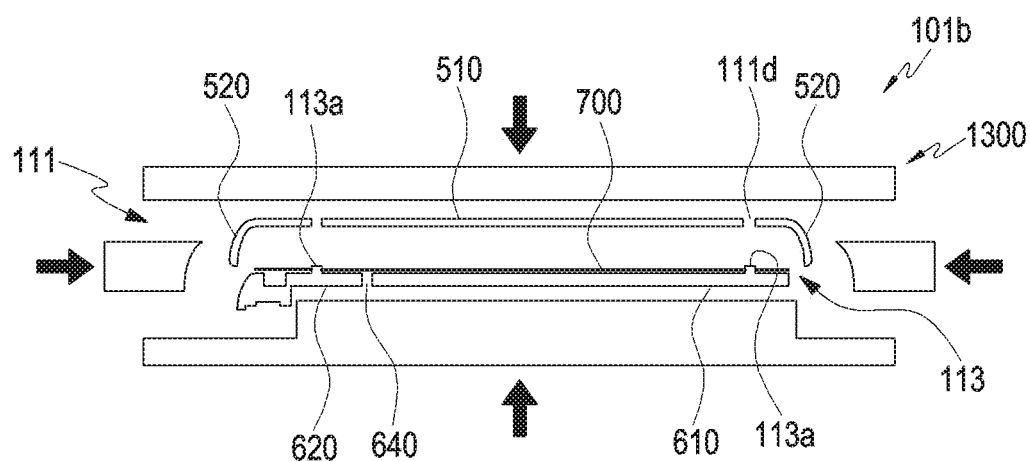

For example, as shown in FIGS. 30A and 30B, after the metal part 111, e.g., the first metal member 510 and the second metal member 520, is aligned with the coupling member (700)-attached insulating part 113, the compression jig(s) 1300 may be provided thereabove, thereunder, and at the four surrounding surfaces.

Figure 30C:
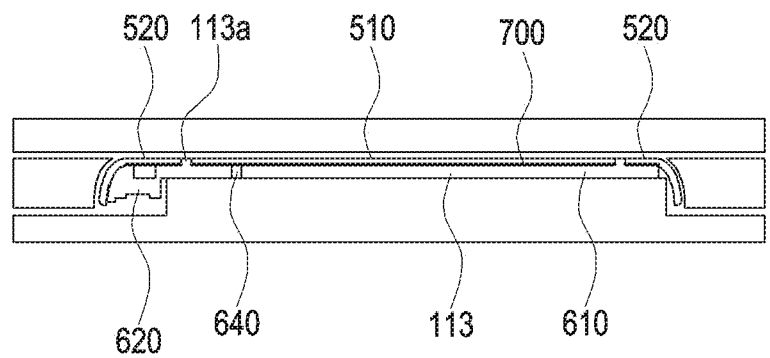

As shown in FIG. 30C, the compression jig(s) 1300 may compress the first metal member 510 and the second metal member 520 from above, under, and the four surrounding surfaces thereof while adjusting the coupling positions of the insulating part 113, which has been segmented into the two non-metallic members 610 and 620 and the first metal member 510 and the second metal member 520. For example, as compressed by the compression jig(s) 1300 with the guide protrusion seated in the long hole, the guide protrusion and/or the two non-metallic members 610 and 620 may be linearly moved along the third (or fourth) direction while the coupling positions may partially be adjusted. For example, in the position where the non-metallic extension part 113*a* tightly contacts the first side parts (511, 512, and 521 of FIGS. 17, 18, and 19) of the first metal member 510 and/or the second side parts (521, 522, and 523 of FIGS. 17, 18, and 19) of the second metal member 520, the insulating part 113 may be attached and fastened to the first metal member 510 and/or the second metal member 520.

Figure 30D:
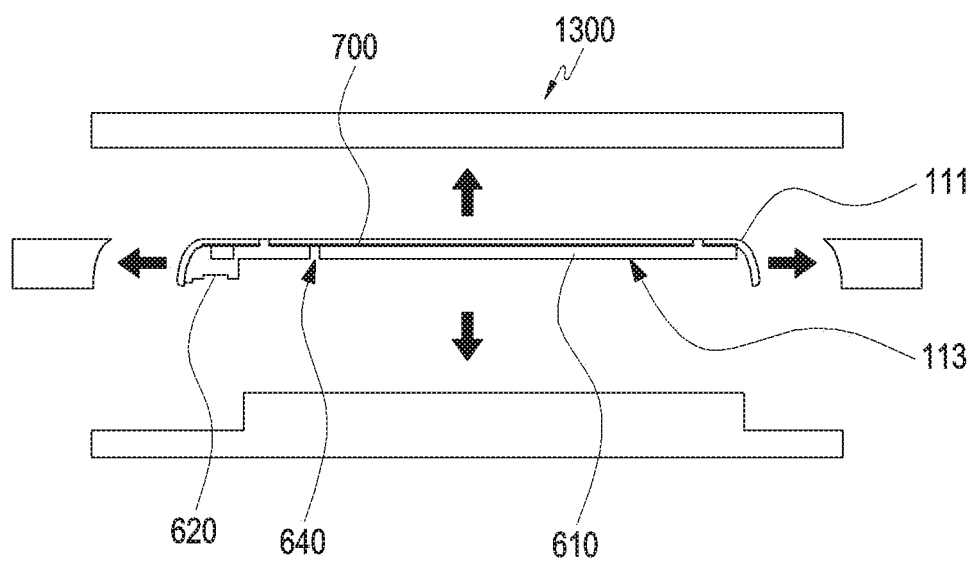

As set forth above, if the insulating part 113 is completely attached and fastened to the metal part 111, the insulating part (113)-attached metal part 111 may be removed from the compression jig(s) 1300 as shown in FIG. 30D. According to an embodiment, the first outer surface 515 of the first metal member 510, the third outer surface 615 of the non-metallic extension part 113*a*, and the second outer surface 525 of the second metal member 520 may form an outer surface of the second plate 101*b* facing in the first direction.

As set forth above, according to various embodiments of the present invention, the housing manufacturing method may manufacture the housing (e.g., the second plate 101*b* of FIG. 1) by coupling the metal members segmented by pressing and cutting, thereby minimizing the number of cutting processes and saving manufacturing time and materials.

As set forth above, according to various embodiments, an electronic device comprises a housing including a first plate facing in a first direction, a second plate facing in a second direction which is opposite to the first direction and facing and spaced apart from the first plate, and a side part surrounding a space between the first plate and the second plate and integrally formed or coupled with the second plate, a display exposed through a portion of the first plate, a wireless communication circuit provided inside the housing, and a processor provided inside the housing and electrically connected with the display and the wireless communication circuit.

The second plate may include a first metal member including a first outer surface facing in the second direction and a second metal member including a second outer surface facing in the second direction and separated from the first metal member by a non-metallic extension part.

The first metal member may further include a first side part facing a portion of the non-metallic extension part in a third direction perpendicular to the first direction.

The second metal member may further include a second side part facing the first side part or another portion of the non-metallic extension part in a fourth direction opposite to the third direction.

The second plate may include an oxidized layer in at least a portion of the first side part and the second side part, the second outer surface, and the first outer surface.

According to various embodiments, the first metal member and the second metal member may include aluminum, and the oxidized layer may include aluminum oxide.

According to various embodiments, a first area of the first side part may include the oxidized layer.

A first area of the second side part may include the oxidized layer.

The first area of the second side part may face the first area of the first side part.

According to various embodiments, a second area of the first side part may lack the oxidized layer to allow a base material of the first metal member to be exposed.

A second area of the second side part may lack the oxidized layer to allow a base material of the second metal member to be exposed.

The second area of the second side part may face the second area of the first side part.

According to various embodiments, the electronic device may further comprise a member for electrically connecting the first metal member and the second metal member between the first metal member and the second metal member.

According to various embodiments, the second plate may include an insulating part coupled to inner surfaces of the first metal member and the second metal member and including the non-metallic extension part.

The insulating part may include two non-metallic members arranged adjacent each other along the third direction or the fourth direction.

At least one of the two non-metallic members may include the non-metallic extension part to form a third outer surface which is seated in a space between the first metal member and the second metal member and faces in the second direction.

According to various embodiments, the electronic device may further comprise a position setting part formed in the first metal member and the second metal member and a guide part formed in each of the non-metallic members.

The position setting part may be provided corresponding to the guide part to set a coupling position of the insulating part and the first metal member and the second metal member.

According to various embodiments, the guide part may include a guide protrusion projecting from one surface of each of the two non-metallic members.

The position setting part may be formed of a hole longer than the guide protrusion in the third direction or the fourth direction, as a hole where the guide protrusion is seated.

According to various embodiments, the electronic device may further comprise a coupling member between the insulating part and each of the first metal member and the second metal member.

According to various embodiments, the non-metallic members may include projecting ribs.

The projecting ribs may be equal or shorter in length than a thickness of the coupling member.

According to an embodiment of the present invention, an electronic device may comprise a first metal member including a first outer surface, a second metal member including a second outer surface facing in the same direction as the first outer surface and spaced apart from the first metal member, and an insulating part attached and coupled to inner surfaces of the first metal member and the second metal member and disposed in a space between the first metal member and the second metal member and inside the first metal member and the second metal member.

The insulating part may be segmented into two non-metallic members. At least one of the non-metallic members may include the non-metallic extension part seated in the space between the first metal member and the second metal member to separate the first metal member from the second metal member.

According to various embodiments, the first metal member may further include a first side part facing the insulating part.

The second metal member may further include a second side part facing the insulating part and the first side part.

An oxidized layer may be formed on the first outer surface, the second outer surface, at least part of the first side part, and at least part of the second side part.

According to various embodiments, the first side part may include a first area with the oxidized layer and a second area without the oxidized layer.

The first side part may include a first area with the oxidized layer and a second area without the oxidized layer.

According to various embodiments, the electronic device may further comprise a position setting part formed in the first metal member and the second metal member and a guide part formed in each of the non-metallic members.

The position setting part may be provided corresponding to the guide part to set a coupling position of the insulating part and the first metal member and the second metal member.

According to various embodiments, there is provided a method of manufacturing a housing of an electronic device, the housing including a first plate facing in a first direction, a second plate facing in a second direction which is opposite to the first direction and facing and spaced apart from the first plate, and a side part surrounding a space between the first plate and the second plate and integrally formed or coupled with the second plate, the method comprising forming a metal part of the second plate; and attaching an insulating part to the formed metal part, wherein the metal part includes a first metal member including a first outer surface facing in the second direction and a second metal member including a second outer surface facing in the second direction and separated from the first metal member by a non-metallic extension part of the insulating part, wherein the first metal member includes a first side part facing the non-metallic extension part in a third direction perpendicular to the first direction, and the second metal member includes a second side part facing the first side part and the insulating part in a fourth direction opposite to the third direction, and wherein forming the metal part includes a surface treatment operation to form an oxidized layer on the first outer surface of the second plate, the second outer surface, and at least a portion of the first side part and at least a portion of the second side part.

According to various embodiments, forming the metal part may include a pressing operation to form a first processed member including a bottom plate and a side member formed at an edge of the bottom plate by press-processing a metal sheet or a metal plate, a first cutting operation to partially remove metal material forming the first processed member and splitting it into at least two segments so that a bridge member is formed between the two segments, thereby forming a second processed member, oxidizing a surface of the second processed member to form an oxidized layer, and removing the bridge member from second processed member where the oxidized layer was formed to thereby segment it into the first metal member and the second metal member, and wherein attaching the insulating part to the formed metal part includes a coupling operation to attach the insulating part to each of an inner surface of the first metal member and/or an inner surface of the second metal member and to place a portion of the insulating part in a space between the first metal member and the second metal member.

According to various embodiments, in the first cutting operation, the bridge member may be stepped from an outer surface of the first processed member.

According to various embodiments, in the second cutting operation, the first side part of the first metal member may include a first area, which, as a cut surface around the bridge member, includes the oxidized layer and a second area, which, as an area formed as the bridge member is removed, lacks the oxidized layer.

The second side part of the second metal member may include a first area, which, as a cut surface around the bridge member, includes the oxidized layer and a second area, which, as an area formed as the bridge member is removed, lacks the oxidized layer.

The first area of the first metal member may face the first area of the second metal member, and the second area of the second metal member may face the second area of the second metal member.

According to various embodiments, in the first cutting operation, a long hole extending in a lengthwise direction of the second processed member may be formed in an inner surface of the second processed member.

In the coupling operation, as a guide protrusion of the insulating part is linearly moved in the long hole, the insulating part may be position-adjusted with respect to the first metal member and the second metal member.

According to various embodiments, the coupling operation may include a first coupling operation to attach a coupling member to one surface of the insulating part and a second coupling operation to attach the insulating part to inner surfaces of the first metal member and the second metal member.

According to various embodiments, the insulating part may be coupled with the first metal member and the second metal member in the second coupling operation, with the insulating part segmented into two non-metallic members.

While the present invention has been shown and described with reference to exemplary embodiments thereof, it will be apparent to those of ordinary skill in the art that various changes in form and detail may be made thereto without departing from the spirit and scope of the present invention as defined by the following claims.

The invention claimed is:

1. An electronic device, comprising:
a housing including a first plate facing in a first direction, a second plate facing in a second direction which is opposite to the first direction and spaced apart and facing away from the first plate, and a side part surrounding a space between the first plate and the second plate and integrally formed or coupled with the second plate;
a display exposed through a portion of the first plate;
a wireless communication circuit provided inside the housing; and
a processor provided inside the housing and electrically connected with the display and the wireless communication circuit,
wherein the second plate includes:
a first metal member including a first outer surface facing in the second direction, and
a second metal member including a second outer surface facing in the second direction and separated from the first metal member by a non-metallic extension part,
wherein the first metal member further includes a first side part facing a portion of the non-metallic extension part in a third direction perpendicular to the first direction, and the second metal member further includes a second side part facing the first side part or another portion of the non-metallic extension part in a fourth direction opposite to the third direction, and
wherein the second plate includes an oxidized layer in at least a portion of the first outer surface, the second outer surface, the first side part and the second side part,
wherein a first area of the first side part includes the oxidized layer, and a first area of the second side part includes the oxidized layer,
wherein a second area of the first side part lacks the oxidized layer to allow a base material of the first metal member to be exposed, and a second area of the second side part lacks the oxidized layer to allow a base material of the second metal member to be exposed, and
wherein the first area of the second side part faces the first area of the first side part, and the second area of the second side part faces the second area of the first side part.

2. The electronic device of claim 1,
wherein the first metal member and the second metal member include aluminum, and
wherein the oxidized layer includes aluminum oxide.

\* \* \* \* \*